(12) United States Patent
Yoshihara et al.

(10) Patent No.: US 9,881,812 B2
(45) Date of Patent: Jan. 30, 2018

(54) POWER MODULE AND FABRICATION METHOD FOR THE SAME

(71) Applicant: ROHM CO., LTD., Kyoto-shi, Kyoto (JP)

(72) Inventors: Katsuhiko Yoshihara, Kyoto (JP); Masao Saito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/227,579

(22) Filed: Aug. 3, 2016

(65) Prior Publication Data

US 2016/0343590 A1 Nov. 24, 2016

Related U.S. Application Data

(63) Continuation of application No. PCT/JP2015/052980, filed on Feb. 3, 2015.

(30) Foreign Application Priority Data

Feb. 5, 2014 (JP) ................................ 2014-020022

(51) Int. Cl.
*H01L 21/48* (2006.01)
*H01L 23/48* (2006.01)
(Continued)

(52) U.S. Cl.
CPC .......... *H01L 21/4825* (2013.01); *H01L 21/52* (2013.01); *H01L 23/48* (2013.01);
(Continued)

(58) Field of Classification Search
CPC ..... H01L 21/4825; H01L 21/52; H01L 23/48; H01L 23/49562; H01L 23/49582;
(Continued)

(56) References Cited

U.S. PATENT DOCUMENTS

2006/0138532 A1* 6/2006 Okamoto .............. H01L 23/051
257/328
2006/0267218 A1* 11/2006 Hozoji .................... H01L 23/24
257/782
(Continued)

FOREIGN PATENT DOCUMENTS

JP  2004-228461 A  8/2004
JP  2005-183463 A  7/2005
(Continued)

OTHER PUBLICATIONS

International Search Report, dated Mar. 17, 2015, PCT/JP20151052980 with English translation (5 pages).

*Primary Examiner* — Shahed Ahmed
(74) *Attorney, Agent, or Firm* — Hamre, Shumann, Mueller & Larson, P.C.

(57) ABSTRACT

The power module includes: a first metallic circuit pattern, a semiconductor device disposed on the first metallic circuit pattern; a leadframe electrically connected to the semiconductor device; and a stress buffering layer disposed on an upper surface of the semiconductor device, and capable of buffering a CTE difference between the semiconductor device and the leadframe. The leadframe is connected to the semiconductor device via the stress buffering layer, a CTE of the stress buffering layer is equal to or less than a CTE of the leadframe, and a cross-sectional shape of the stress buffering layer is L-shape. There is provided: the power module capable of realizing miniaturization and large current capacity, and reducing cost thereof by using leadframe structure, and capable of reducing a variation in welding and improving a yield without damaging a semiconductor device; and a fabrication method for such a power module.

20 Claims, 30 Drawing Sheets

FIG. 12A

(51) Int. Cl.
*H01L 23/00* (2006.01)
*H01L 25/07* (2006.01)
*H01L 21/52* (2006.01)
*H01L 23/495* (2006.01)
*H01L 23/498* (2006.01)
*H01L 25/065* (2006.01)

(52) U.S. Cl.
CPC .. *H01L 23/49562* (2013.01); *H01L 23/49582* (2013.01); *H01L 23/49586* (2013.01); *H01L 23/49861* (2013.01); *H01L 24/36* (2013.01); *H01L 24/40* (2013.01); *H01L 25/0655* (2013.01); *H01L 25/072* (2013.01); *H01L 2224/32225* (2013.01); *H01L 2224/40137* (2013.01); *H01L 2224/40139* (2013.01); *H01L 2224/40225* (2013.01); *H01L 2224/45147* (2013.01); *H01L 2224/48137* (2013.01); *H01L 2224/48139* (2013.01); *H01L 2224/48227* (2013.01); *H01L 2224/48472* (2013.01); *H01L 2224/73265* (2013.01); *H01L 2924/00011* (2013.01); *H01L 2924/1033* (2013.01); *H01L 2924/10253* (2013.01); *H01L 2924/10272* (2013.01); *H01L 2924/13055* (2013.01); *H01L 2924/181* (2013.01)

(58) Field of Classification Search
CPC ......... H01L 23/49586; H01L 23/49861; H01L 24/36; H01L 24/40; H01L 25/0655; H01L 25/072; H01L 2224/32225; H01L 2224/40137; H01L 2224/40139; H01L 2224/40225; H01L 2224/45147
USPC ........ 257/734, 735, 747, 764, 784; 438/122, 438/123
See application file for complete search history.

(56) References Cited

U.S. PATENT DOCUMENTS

2012/0287602 A1* 11/2012 Urano .................. F21V 19/045
362/84
2015/0048068 A1* 2/2015 Matsushita ............. H01L 24/40
219/121.64

FOREIGN PATENT DOCUMENTS

| | | |
|---|---|---|
| JP | 2006-13080 A | 1/2006 |
| JP | 2006-352080 A | 12/2006 |
| JP | 2007-165690 A | 6/2007 |
| JP | 2008-66561 A | 3/2008 |
| JP | 2008-98586 A | 4/2008 |
| JP | 2010-278107 A | 12/2010 |
| JP | 2011-216766 A | 10/2011 |
| JP | 2013-165207 A | 8/2013 |

* cited by examiner

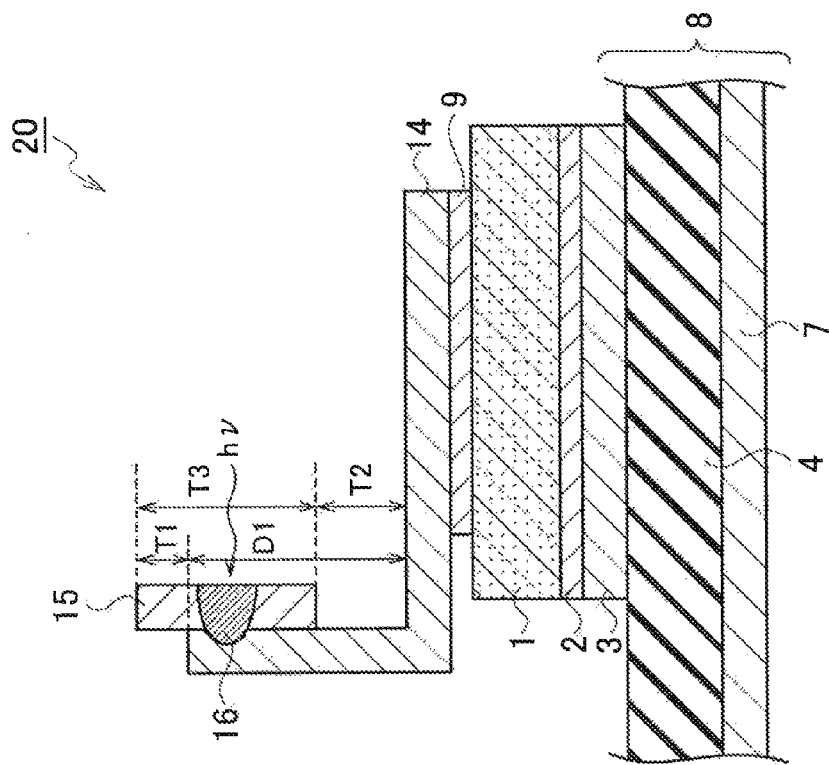
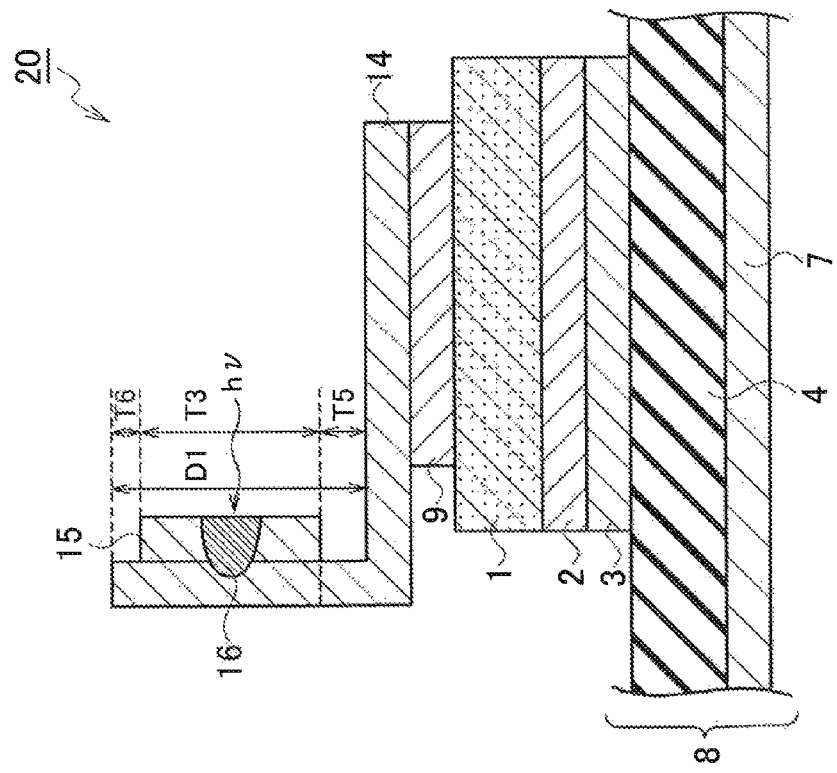

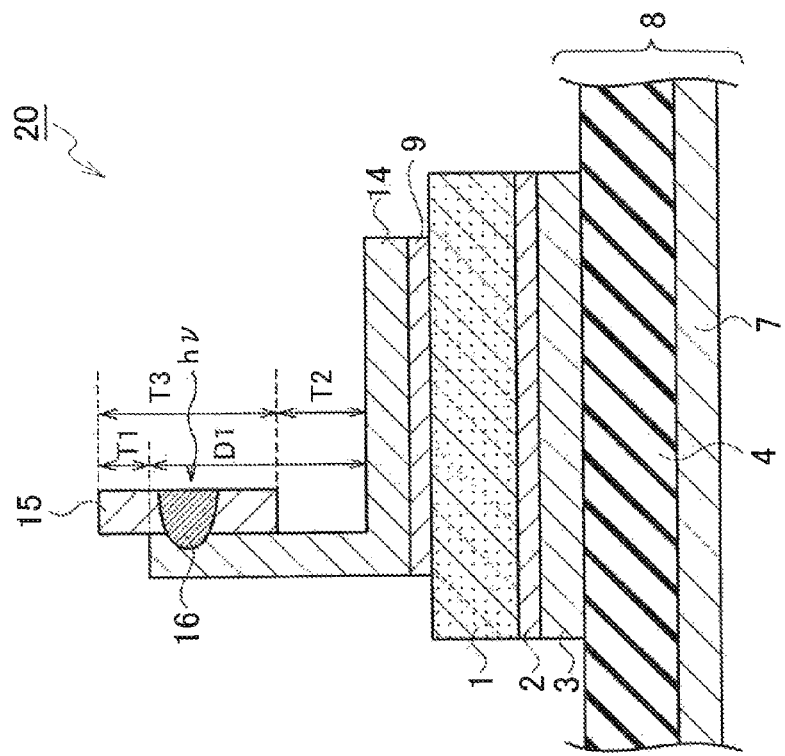
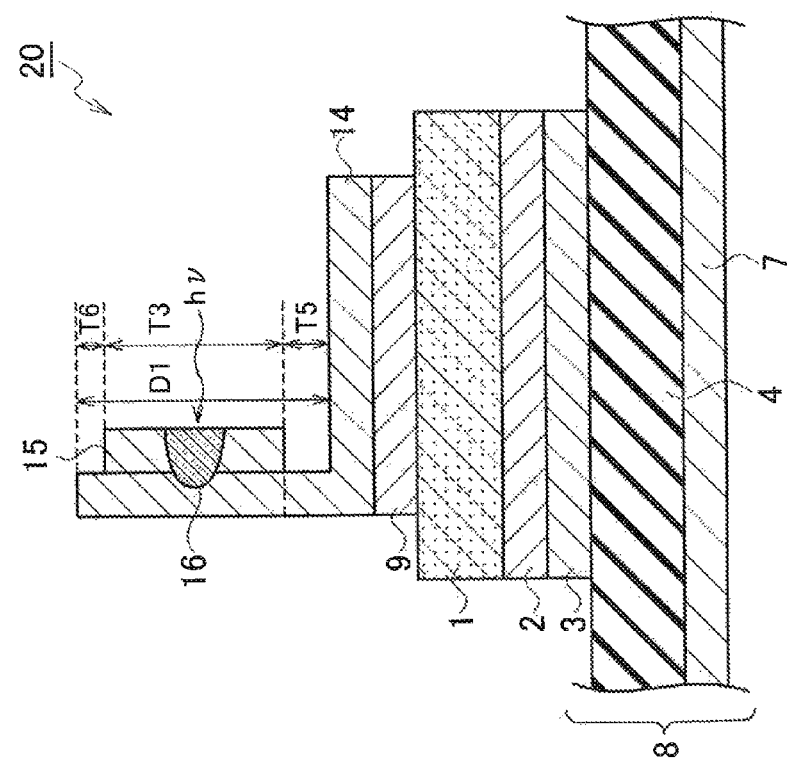

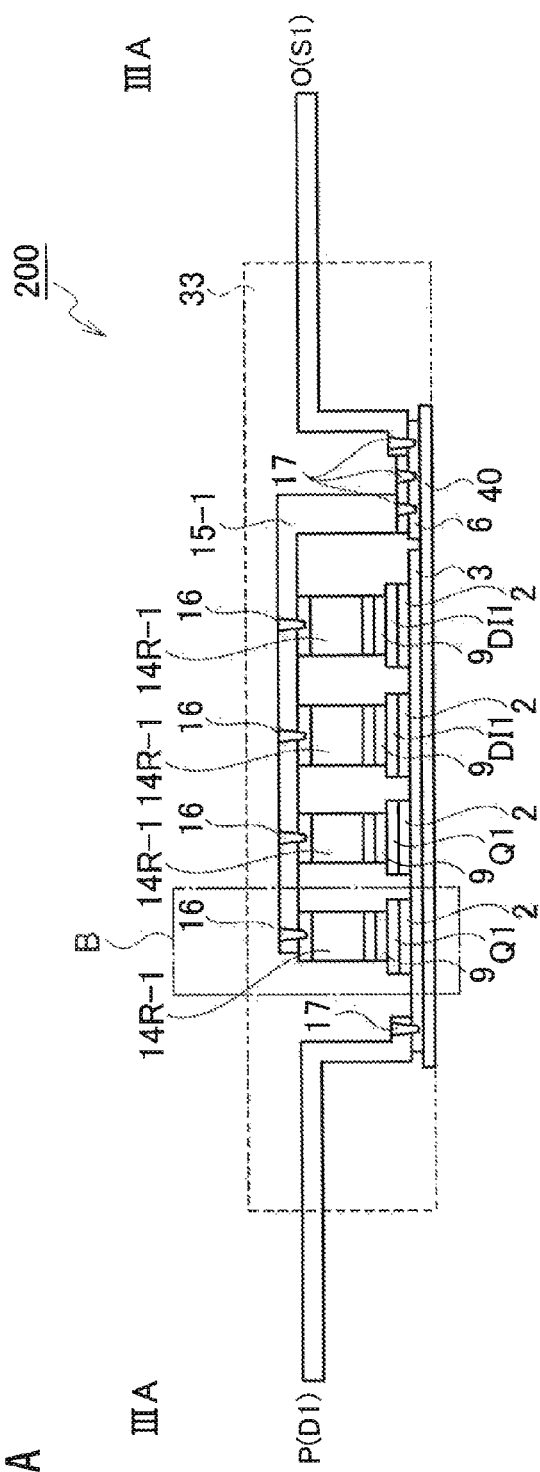
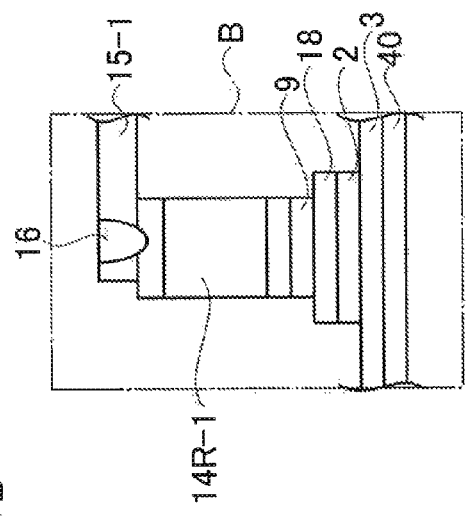
FIG. 25A
FIG. 25B

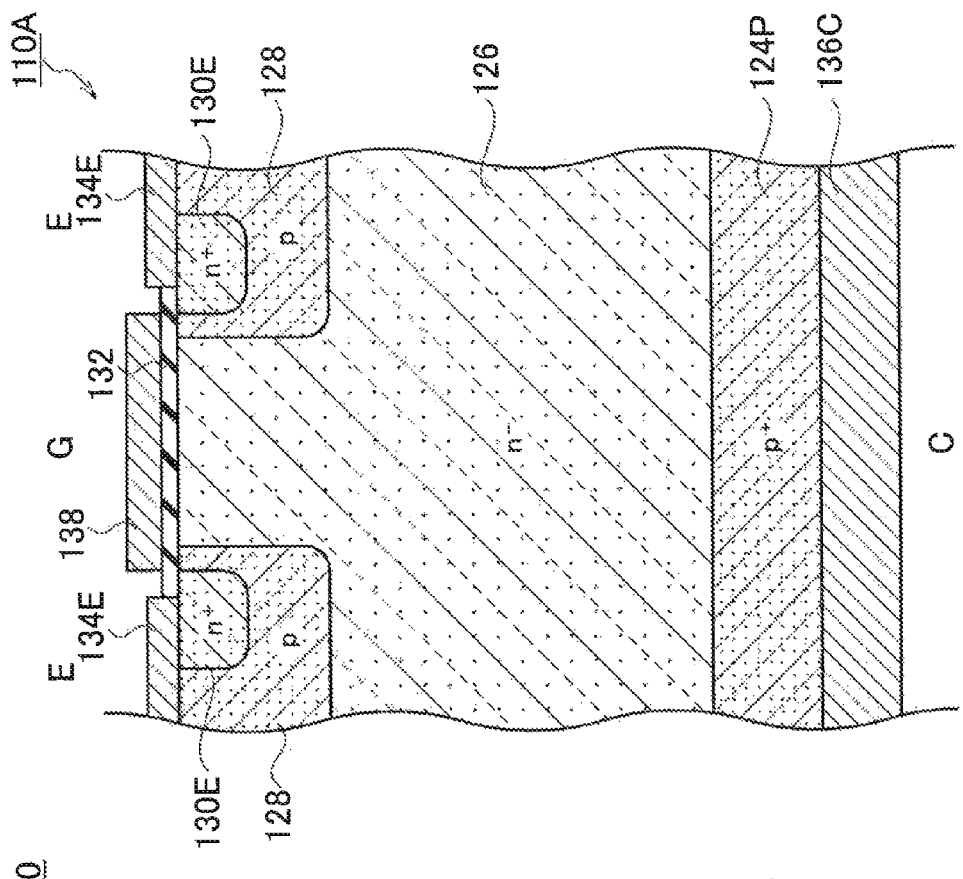
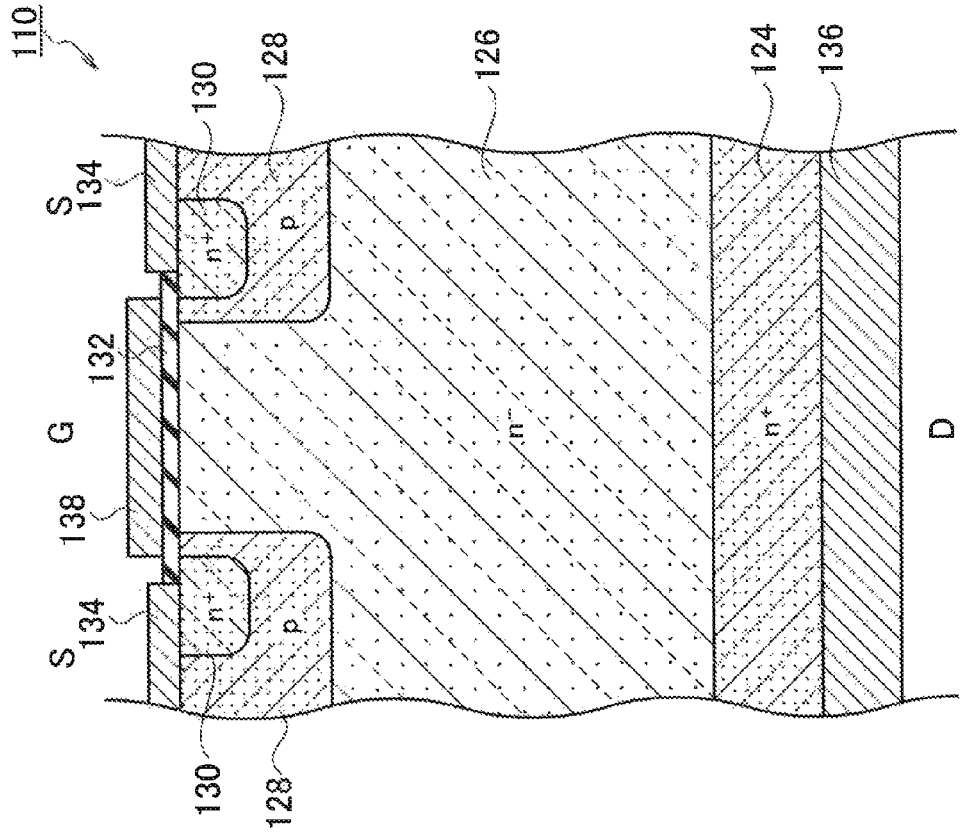

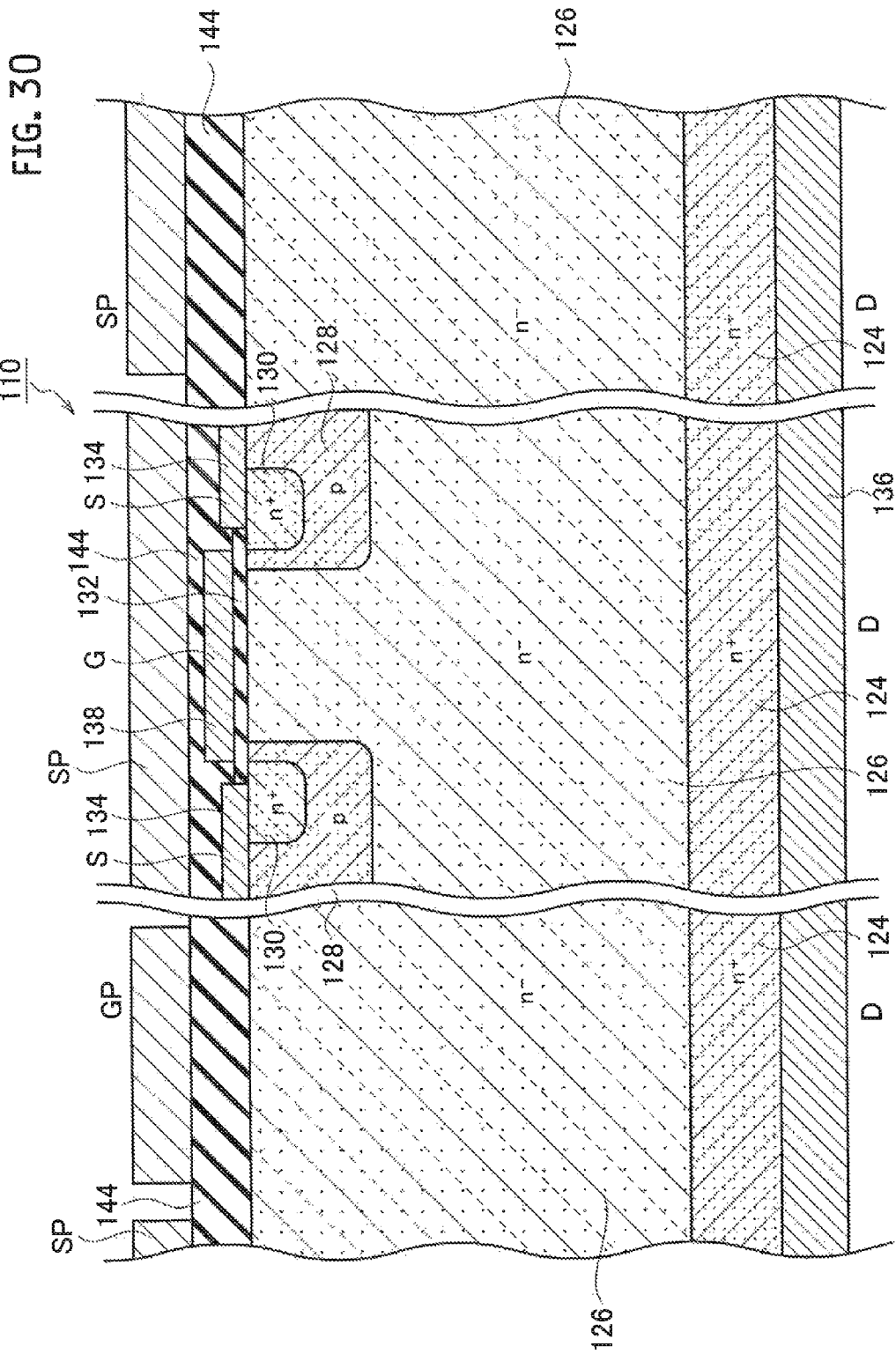

POWER MODULE AND FABRICATION METHOD FOR THE SAME

CROSS REFERENCE TO RELATED APPLICATIONS

This is a continuation application (CA) of PCT Application No. PCT/JP2015/052980, filed on Feb. 3, 2015, which claims priority to Japan Patent Application No. P2014-20022 filed on Feb. 5, 2014 and is based upon and claims the benefit of priority from prior Japanese Patent Application No. P2014-20022 filed on Feb. 5, 2014 and PCT Application No. PCT/JP2015/052980, filed on Feb. 3, 2015, the entire contents of each of which are incorporated herein by reference.

FIELD

The embodiments described herein relate to a power module and a fabrication method for such a power module. The embodiments relate in particular to a power module having leadframe wiring structure and a fabrication method for such a power module.

BACKGROUND

Many research institutions are currently conducting research to develop Silicon Carbide (SiC) devices. Advantages of SiC power devices over Si power devices include low on resistance, high switching speed, high temperature operation characteristics, etc.

SiC power modules can conduct a large electric current, and can be easily operated under high temperature conditions operation, since losses produced by Si power devices are relatively smaller. However, power module design has been required for achieving such SiC power modules.

Case type packages is used as packages of the SiC power devices.

On the other hand, there is also disclosed a semiconductor device which is resin-sealed by transfermold technique.

In conventional power modules, there is also disclosed an example of applying a laser welding technology without using bonding materials for bonding between a stress buffering layer and a leadframe in a connecting structure between a heat spreader and a metallic plate, or a connecting structure of electrode wirings.

SUMMARY

There has been a limit to electric wirings using conventional aluminum wires with respect to needs for miniaturization of power modules and large current use therein. Regarding such a problem, there have been proposed means for thickening of wire by using aluminum wires measuring 500 μm in diameter instead of aluminum wires measuring 400 μm in diameter, for example; means for reducing resistance and improving electrical conduction by using copper wires; means for reducing resistance and improving electrical conduction by using aluminum ribbons having an approximately width of 12 mm and an approximately thickness of 0.5 mm, for example, etc. However, there has been further requested for improving current density in electric vehicles and hybrid vehicles. Moreover, there have been needs for reduction of a mounting volume by miniaturizing and simplifying cooling devices, or deleting cooling devices.

Regarding such problems, the thickening of wire, the use of the copper wired, and the use of the aluminum ribbons are insufficient. If the aluminum wires are listed as an illustrative example, an electric current which can be conducted into an aluminum wire having approximately 15 mm in length and approximately 400 μm in diameter is nearly 20 A. If an amount of current equal to or greater than such an electric current is regularly conducted thereinto, the electric wiring will be fused. Even in the case where the thickening of wire, the use of the copper wired, and the use of the aluminum ribbons are implemented, the electric current which can be conducted thereinto is merely approximately 1.5 times as much as 20 A, i.e., approximately 30 A, for example.

The embodiments provide: a power module capable of realizing miniaturization and large current capacity, and reducing cost thereof by using leadframe structure, and capable of reducing a variation in welding and improving a yield without damaging a semiconductor device; and a fabrication method for such a power module.

According to one aspect of the embodiments, there is provided a power module comprising: a first metallic circuit pattern; a semiconductor device disposed on the first metallic circuit pattern; a leadframe electrically connected to the semiconductor device; and a stress buffering layer disposed on an upper surface of the semiconductor device, stress buffering layer capable of buffering a coefficient of thermal expansion (CTE) difference between the semiconductor device and the leadframe, wherein the leadframe is connected to the semiconductor device via the stress buffering layer, wherein a CTE of the stress buffering layer is equal to or less than a CTE of the leadframe, and a cross-sectional shape of the stress buffering layer is L-shape.

According to another aspect of the embodiments, there is provided a power module comprising: a first metallic circuit pattern; a semiconductor device disposed on the first metallic circuit pattern; a leadframe electrically connected to the semiconductor device; and a stress buffering layer disposed on an upper surface of the semiconductor device, stress buffering layer capable of buffering a coefficient of thermal expansion (CTE) difference between the semiconductor device and the leadframe, wherein the leadframe is connected to the semiconductor device via the stress buffering layer, wherein a CTE of the stress buffering layer is equal to or less than a CTE of the leadframe, and a cross-sectional shape of the stress buffering layer is U-shape.

According to still another aspect of the embodiments, there is provided a fabrication method for a power module comprising: forming a first metallic circuit pattern; forming a semiconductor device on the first metallic circuit pattern; forming a stress buffering layer of which a cross-sectional shape is L-shape on an upper surface of the semiconductor device; and connecting a leadframe to the stress buffering layer at an L-shaped side surface of the stress buffering layer in a direction vertical to the upper surface of the semiconductor device, wherein a coefficient of thermal expansion (CTE) of the stress buffering layer is equal to or less than a CTE of the leadframe, and the stress buffering layer can buffer a CTE difference between the semiconductor device and the leadframe.

According to yet another aspect of the embodiments, there is provided a fabrication method for a power module comprising: forming a first metallic circuit pattern; forming a semiconductor device on the first metallic circuit pattern; forming a stress buffering layer of which a cross-sectional shape is U-shape on an upper surface of the semiconductor device; and connecting a leadframe to the stress buffering layer at a U-shaped side surface of the stress buffering layer isolated from the upper surface of the semiconductor device in a direction parallel to the upper surface of the semiconductor device, wherein a coefficient of thermal expansion (CTE) of the stress buffering layer is equal to or less than a CTE of the leadframe, and the stress buffering layer can buffer a CTE difference between the semiconductor device and the leadframe.

According to the embodiments, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

BRIEF DESCRIPTION OF DRAWINGS

FIG. 13A is a schematic cross-sectional structure diagram of layered structure of a ceramics substrate/first metallic circuit pattern/bonding layer under chip/semiconductor device/bonding layer on chip/L-shaped stress buffering layer, in a power module according to a modified example 1 of the first embodiment.

FIG. 13B is a schematic cross-sectional structure diagram of a portion of which the thicknesses are different from one another in the above-mentioned layered structure, in the power module according to the modified example 1 of the first embodiment.

FIG. 14A is a schematic cross-sectional structure diagram of layered structure of a ceramics substrate/first metallic circuit pattern/bonding layer under chip/semiconductor device/bonding layer on chip/L-shaped stress buffering layer, in a power module according to a modified example 2 of the first embodiment.

FIG. 14B is a schematic cross-sectional structure diagram of a portion of which the thicknesses are different from one another in the above-mentioned layered structure, in the power module according to the modified example 2 of the first embodiment.

FIG. 25A is a side view diagram observed from the direction IIIA-IIIA in FIG. 24.

FIG. 25B is an enlarged view of B portion of FIG. 25A.

FIG. 29A is a schematic cross-sectional structure diagram of the SiC MISFET, which is an example of a semiconductor device to be applied to the power module according to the embodiments.

FIG. 29B is a schematic cross-sectional structure diagram of the IGBT, which is an example of the semiconductor device to be applied to the power module according to the embodiments.

FIG. 30 is a schematic cross-sectional structure diagram showing an SiC MISFET including a source pad electrode SP and a gate pad electrode GP, which is an example of the semiconductor device to be applied to the power module according to the embodiments.

DESCRIPTION OF EMBODIMENTS

Figure 1:
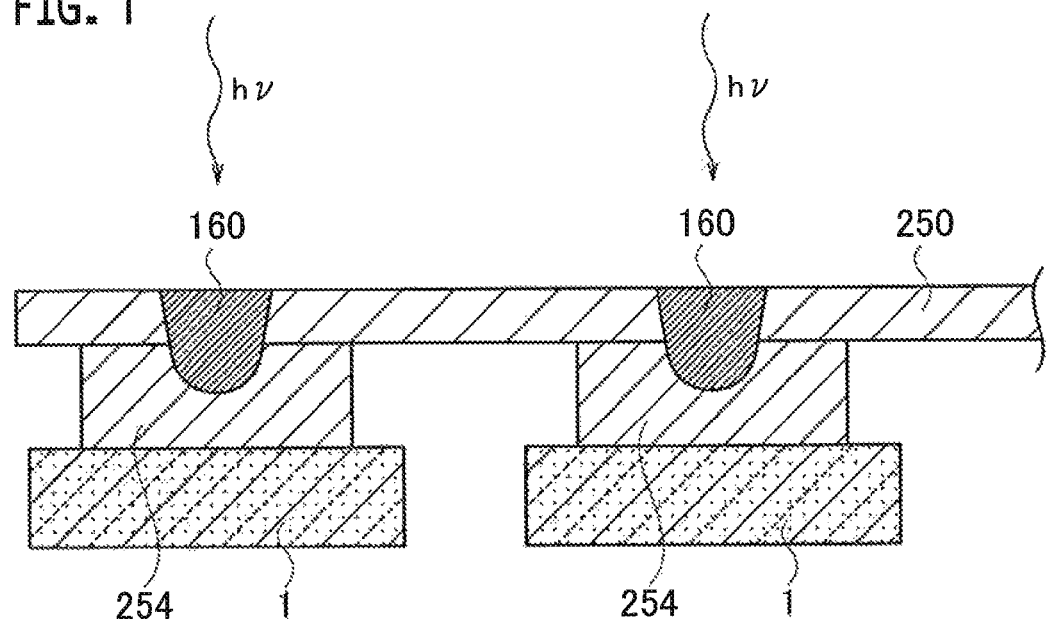
FIG. 1 is a schematic explanatory diagram of laser light irradiation, in a power module according to a comparative example.

Next, certain embodiments will be described with reference to drawings. In the description of the following drawings, the identical or similar reference numeral is attached to the identical or similar part. However, it should be noted that the drawings are schematic and the relation between thickness and the plane size and the ratio of the thickness of each component part differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

Comparative Examples

In a power module according to a comparative example, FIG. 1 shows a schematic cross-sectional structure for explaining an aspect of forming a laser welding portion 160, by being irradiated with laser light hv, in electrode connection structure for connecting a stress buffering layer (CuMo electrode) 254 disposed on a semiconductor device 1 and a leadframe (Cu) 250.

As a stress buffering layer, a Cu/CuMo cladding or Cu/CuW cladding are applicable. CuMo and CuW are sintered body of Cu and Mo, or Cu and W, and therefore are expensive. It is necessary to form a cladding layer structure in which Cu is cladded on at least one side of such materials, and therefore it becomes a still more expensive materials.

Figure 2:
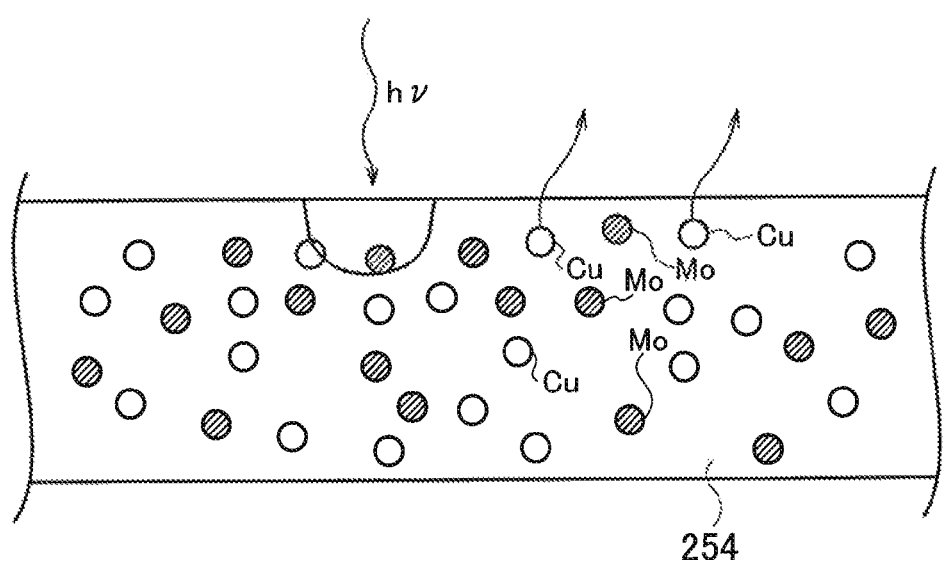
FIG. 2 is a schematic explanatory diagram in the case of irradiating CuMo with the laser light, in the power module according to the comparative example.

FIG. 2 shows an aspect that the stress buffering layer (CuMo electrode) 254 is irradiated with the laser light hv, in the power module according to the comparative example.

Although CuMo and CuW are effective as the stress buffering layer 254, inconvenience called sputtering of Cu will occur if the stress buffering layer 254 is weld to the leadframe (Cu) 250 using YAG laser. More specifically, the melting point of Cu is 1083 degrees C. when the stress buffering layer (CuMo electrode) 254 is irradiated with laser light hv as schematically shown in FIG. 2. However, since the melting point of Mo is 2620 degrees C., CuMo is necessary to be heated up to at least 2620 degrees C., if CuMo is fused with the YAG laser light. However, since the boiling point of Cu is 2570 degrees C., the boiling point of Cu is exceeded at the time when melting Mo in CuMo. Consequently, such a melted portion by the laser light will be sputtered. Also in the case of CuW, since the melting point of W is 3400 degrees C., the same result will be brought.

In order to avoid such a problem, it is possible to use a Cu/CuMo cladding in which Cu is laminated on an upper surface of the CuMo materials. In the case of CuW, it is possible to use a Cu/CuW cladding.

Figure 3:
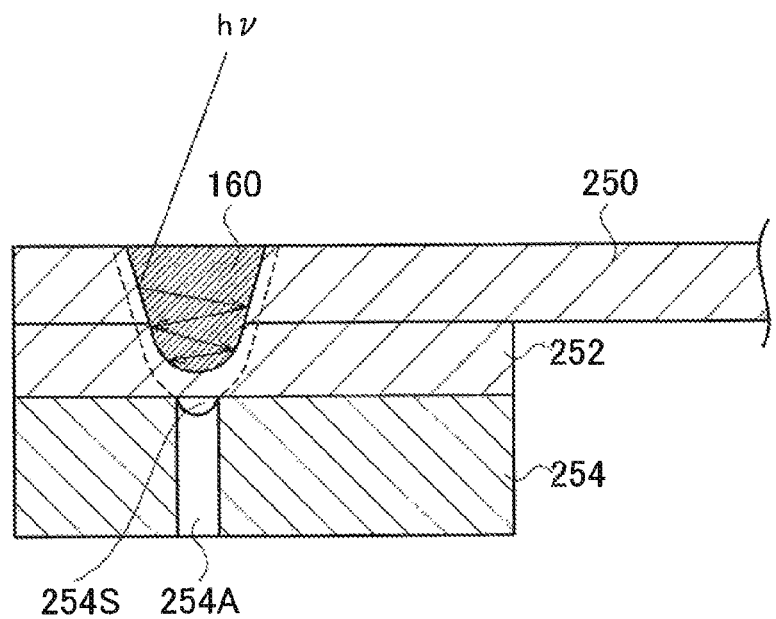
FIG. 3 is a schematic explanatory diagram in the case of irradiating Cu/CuMo cladding with the laser light, in the power module according to the comparative example.

In the power module according to the comparative example, FIG. 3 shows an aspect that the leadframe 250 and the Cu cladding layer 252 are laser-welded by being irradiated with the laser light hv via the leadframe 250, in structure of disposing the leadframe 250 on the Cu cladding layer/the CuMo stress buffering layer 254. As shown in FIG. 3, while the laser light hv is scattered in a welded portion 160, melting of the welded portion 160 advances. When the melting of the welded portion 160 advances up to the bottom of the Cu cladding layer 252 and then reaches to the surface 254S of the CuMo stress buffering layer 254, a cavity portion 254A will be easily formed in the CuMo stress buffering layer 254. Moreover, if such clad structure is used as the stress buffering layer 254, the leadframe 250 is laminated directly above the semiconductor device 1 to be welded by being irradiated with the YAG laser light hv thereon, the laser light may reach to the plane of the semiconductor device due to welding variation.

Figure 4:
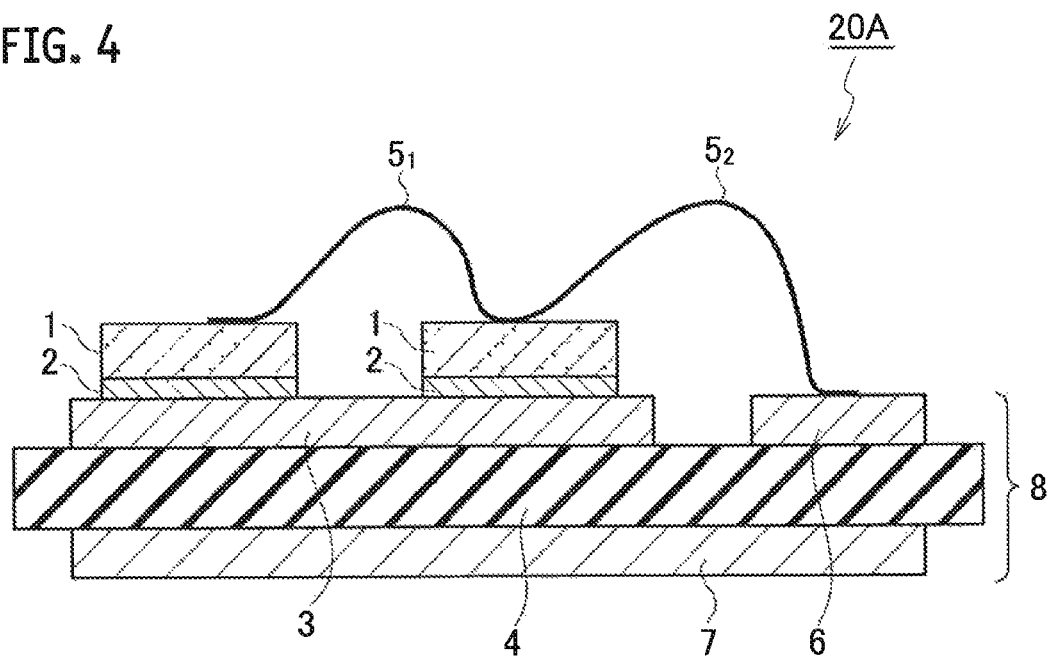
FIG. 4 is a schematic cross-sectional structure diagram showing a power module according to a comparative example 1.
Figure 5:
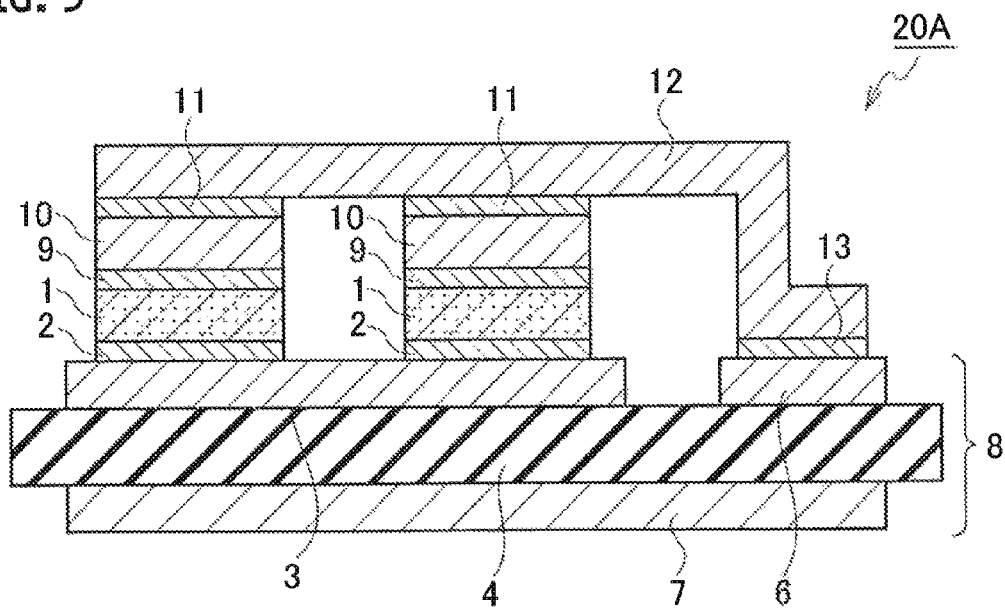
FIG. 5 is a schematic cross-sectional structure diagram showing a power module according to a comparative example 2.
Figure 6:
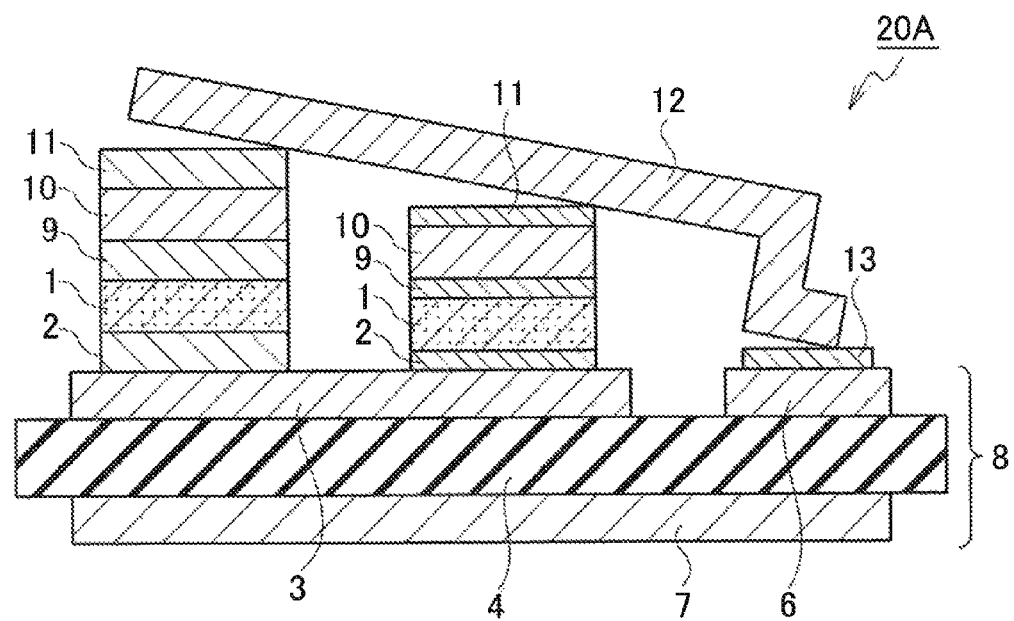
FIG. 6 is a schematic cross-sectional structure diagram showing a power module according to a comparative example 3.

FIG. 4 shows a schematic cross-sectional structure of a power module 20A according to a comparative example 1, FIG. 5 shows a schematic cross-sectional structure of a power module 20A according to a comparative example 2, and FIG. 6 shows a schematic cross-sectional structure of a power module 20A according to a comparative example 3.

The power module 20A according to the comparative example 1 has wiring structure with wiring, as shown in FIG. 4. Moreover, the power modules according to the comparative examples 2 and 3 have wiring structure with leadframe wiring, as shown in FIGS. 5 and 6.

As shown in FIG. 4, the power module 20A according to the comparative example 1 includes: semiconductor devices 1 disposed on the insulating circuit substrate 8 via the bonding layer under chip 2; a bonding wire $5_1$ for connecting between the semiconductor devices 1; and a bonding wire $5_2$ for connecting the semiconductor device 1 and a surface copper foil 6. The insulating circuit substrate 8 includes: a ceramics substrate 4, surface copper foils 3, 6 disposed on a surface of the ceramics substrate 4, and back surface copper foil 7 disposed on a back side surface of the ceramics substrate 4.

As shown in FIGS. 5, 6, the power modules 20A according to comparative examples 2, 3 respectively include: semiconductor devices 1 disposed on an insulating circuit substrate 8 via a bonding layer under chip 2; bonding layers 9 respectively disposed on the semiconductor devices 1; stress buffering layers 10 respectively disposed on the bonding layers 9 on chip; bonding layers 11 respectively disposed on the stress buffering layer 10; and a leadframe 12 disposed on the bonding layers 11 on stress buffering layer. Moreover, the leadframe 12 is connected via the surface copper foil 6 and the bonding layer 13 under leadframe respectively disposed on a surface of the ceramics substrate 4.

When the copper or aluminum leadframe 12 is bonded to the upper surface of the semiconductor device 1, if the bonded surface is exposed to an environment of repeating cooling and heating due to a difference in coefficients of thermal expansion (CTE), a stress will occur in the bonded surface and then a crack will occur in the bonding materials or the semiconductor chip. In order to avoid such a problem, it is possible to insert materials near the CTE of the semiconductor device (Si or SiC) 1 between the upper surface of the semiconductor device 1 and the leadframe 12, as shown in FIGS. 5 and 6, instead of bonding the copper or aluminum leadframe 12 directly to upper surface of the semiconductor device 1. More specifically, a value of the CTE of Si or SiC is approximately $3 \times 10^{-6}$/K, and values of the CTEs of the copper leadframe and the aluminum leadframe are approximately $17 \times 10^{-6}$/K and approximately $24 \times 10^{-6}$/K. Accordingly, as shown in FIGS. 5 and 6, relatively low CTE materials (stress buffering layer 10), e.g. a molybdenum plate, a tungsten plate, a CuMo sintered body, and a CuW sintered body are inserted between the upper surface of the semiconductor device (Si, SiC) 1 and the leadframes 12. In this case, the CTE of CuMo are approximately $8 \times 10^{-6}$/K to approximately $10 \times 10^{-6}$/K, for example.

In the layered structure including the semiconductor device 1/the bonding layer 9 on chip/the stress buffering layer 10/the bonding layer 11 on stress buffering layer/the leadframe 12, although a variation in the heights will not be a problem if the semiconductor device 1 is one-chip, since a plurality of chips (semiconductor devices 1) are actually arranged in parallel in order to secure current capacity, as shown in FIG. 6, a variation in thickness occurs, and therefore it is difficult to realize wiring using the leadframe 12.

First Embodiment

A laser applicable as a fabricating technology of a power module according to the first embodiment is any one of second harmonics of a YAG laser or YAG laser, a YLF (an Yttrium Lithium Fluoride ($YLiF_4$)) laser, a $YVO_4$ (an Yttrium Vanadium Oxide ($YVO_4$)) laser, a KrF laser, a $CO_2$ laser, or a CO laser, for example.

Figure 7:
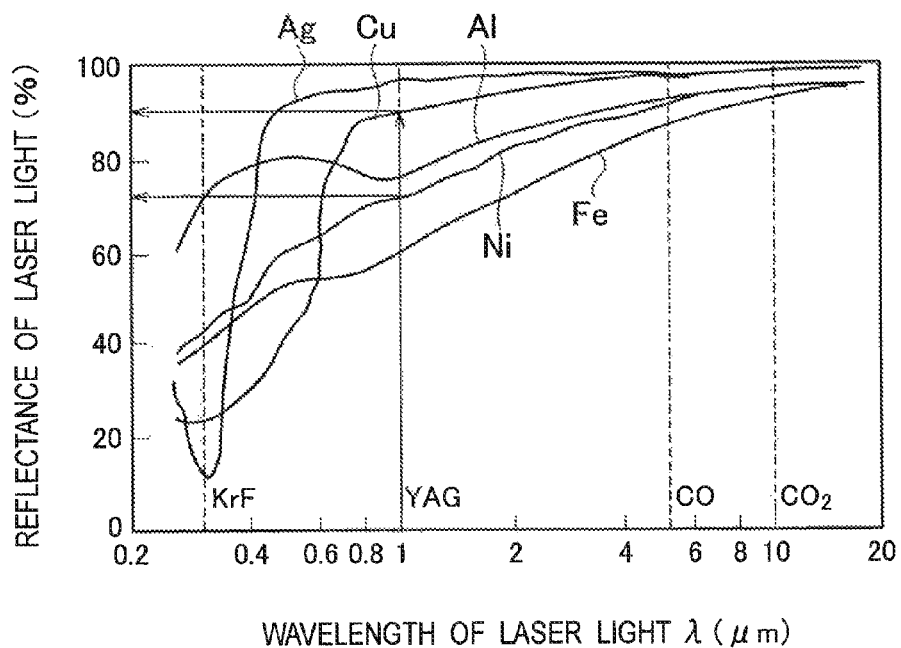
FIG. 7 is a relational chart between a reflectance R of laser light and a wavelength λ of laser light with which metallic materials are irradiated.

FIG. 7 shows a relationship between reflectance of the laser light R (%) and wavelength of laser light λ (μm) with respect to metallic materials (Ag, Cu, Al, Ni, Fe).

Figure 8:
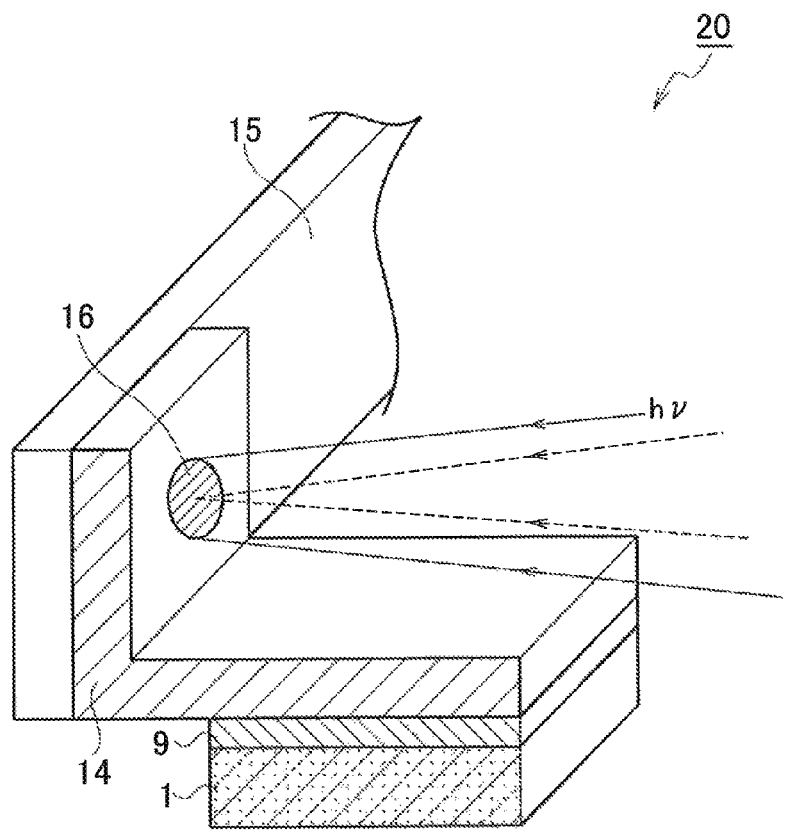
FIG. 8 is a principle explanatory diagram of laser light irradiation in a power module according to the first embodiment.

FIG. 8 shows principle explanation of the laser light irradiation, in the power module 20 according to the first embodiment.

The power module 20 according to the first embodiment includes structure of inserting materials having relatively low CTE, between the semiconductor device 1 and the leadframe 15, as a stress buffering layer 14 for buffering of the coefficient of thermal expansion (CTE) difference between the semiconductor device 1 and the leadframe 15, in the power module in which the semiconductor device 1 is installed on a substrate surface, and the leadframe 15 is bonded to an upper surface of the semiconductor device 1, as shown in FIG. 8. In the present embodiment, the CTE of the stress buffering layer 14 is equal to or less than the CTE of the leadframe 15, and a shape of the stress buffering layer 14 is L-shape.

The stress buffering layer 14 and the leadframe 15 are connected to each other, by the laser welding technology, at the L-shaped side surface of the stress buffering layer 14 in a direction vertical to the upper surface of the semiconductor device 1, as shown in FIG. 8. It is preferable to that the surface of the stress buffering layer 14 is irradiated with laser light hv in a defocus condition since an area of the laser welding portion 160 can be extended, as shown with the solid line in FIG. 8; instead that the surface of the stress buffering layer 14 is not irradiated with the laser light hv in a focus condition, as shown with the dashed line in FIG. 8.

Figure 9:
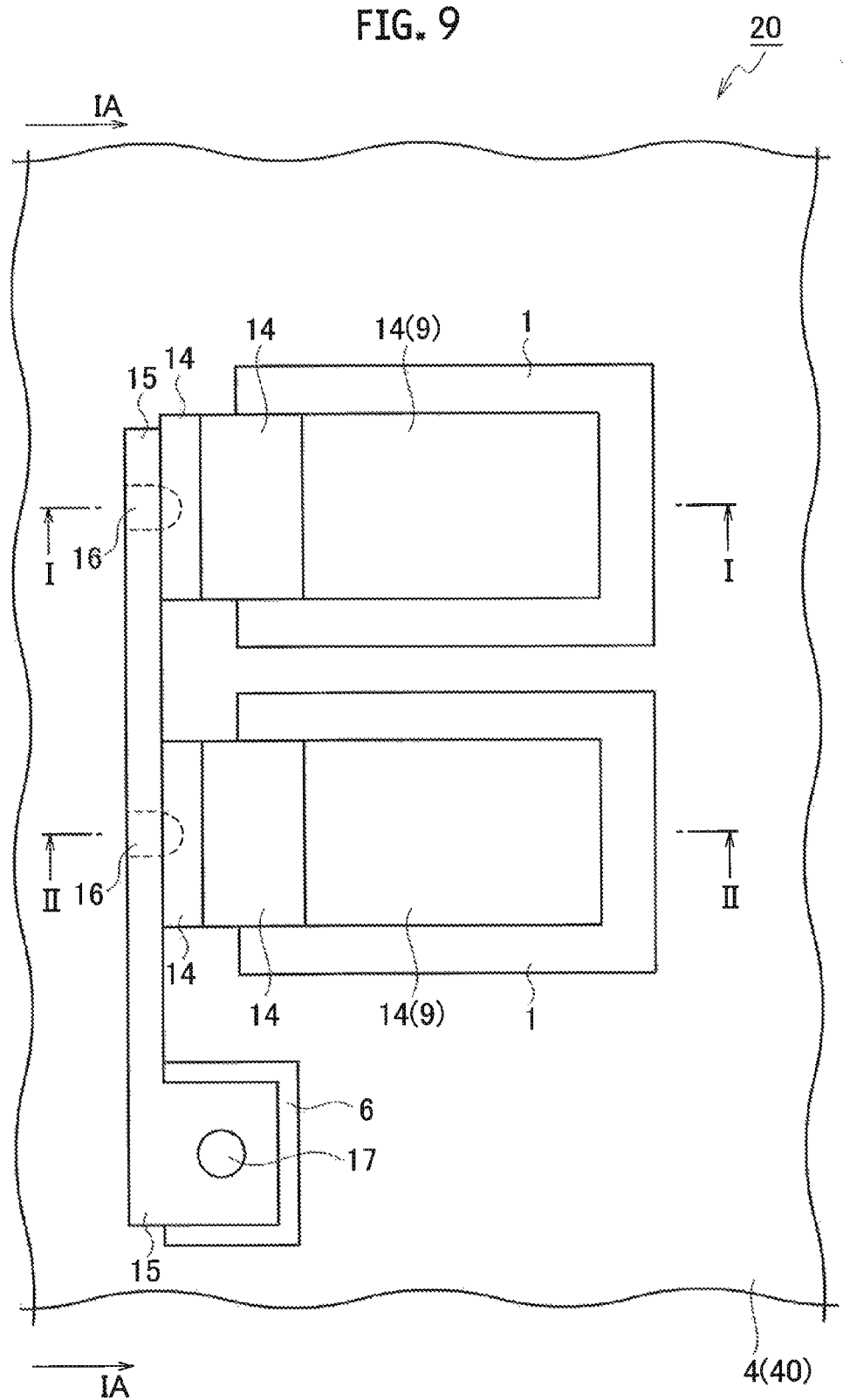
FIG. 9 is a schematic planar pattern configuration diagram showing the power module according to the first embodiment.
Figure 10:
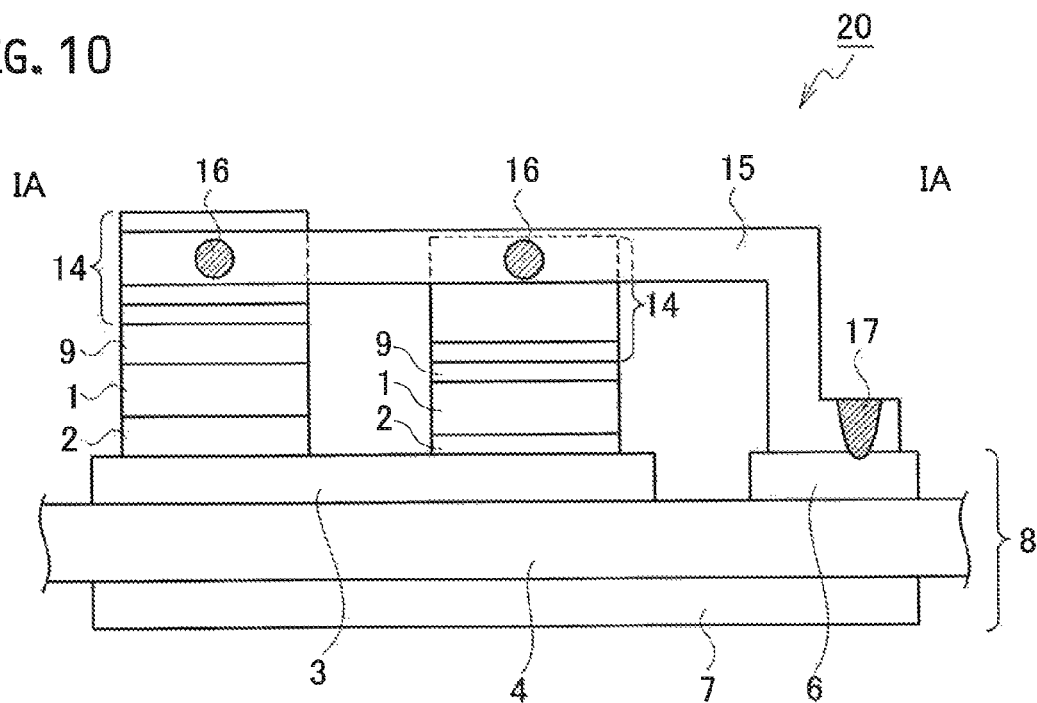
FIG. 10 is a side view diagram observed from the direction IA-IA in FIG. 9.
Figure 11:
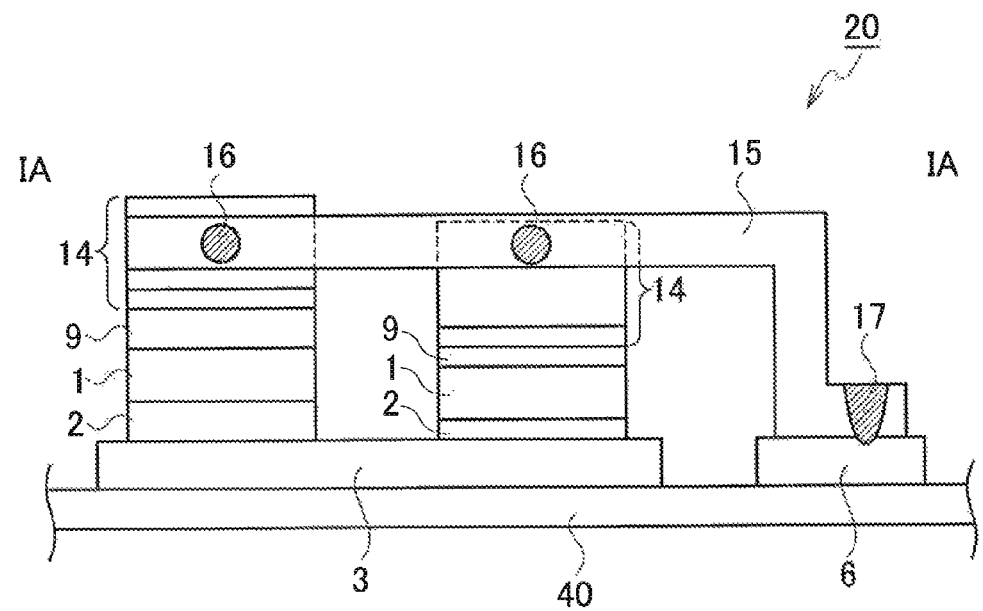
FIG. 11 is another side view diagram observed from the direction IA-IA in FIG. 9.
Figure 12A:
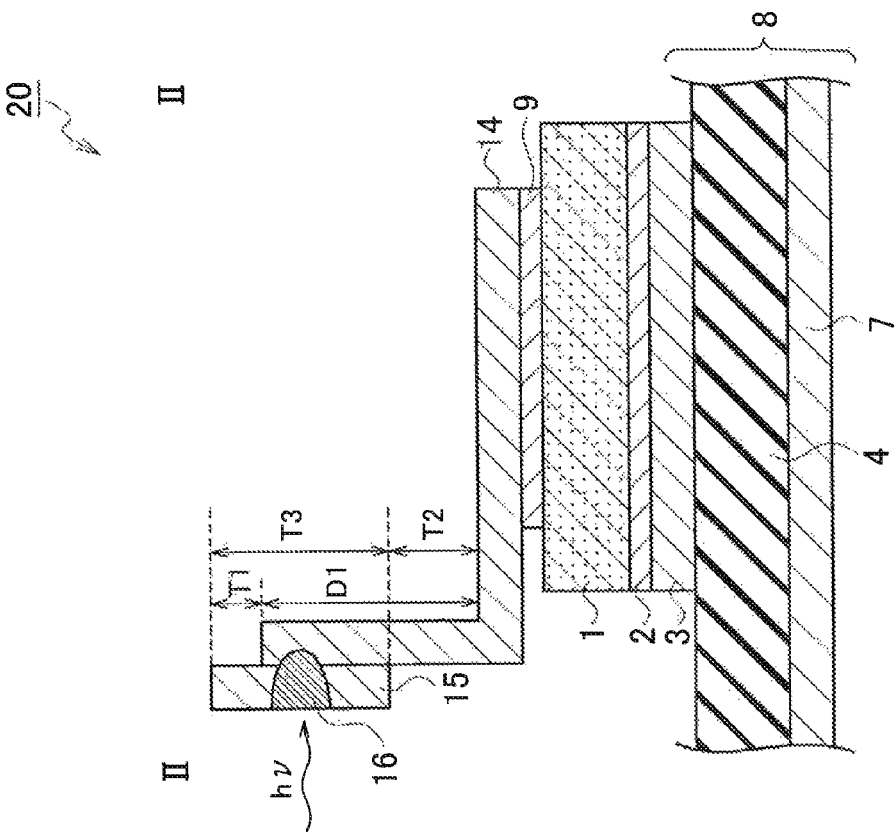
FIG. 12A is a schematic cross-sectional structure diagram taken in the line I-I of FIG. 9.
Figure 12B:
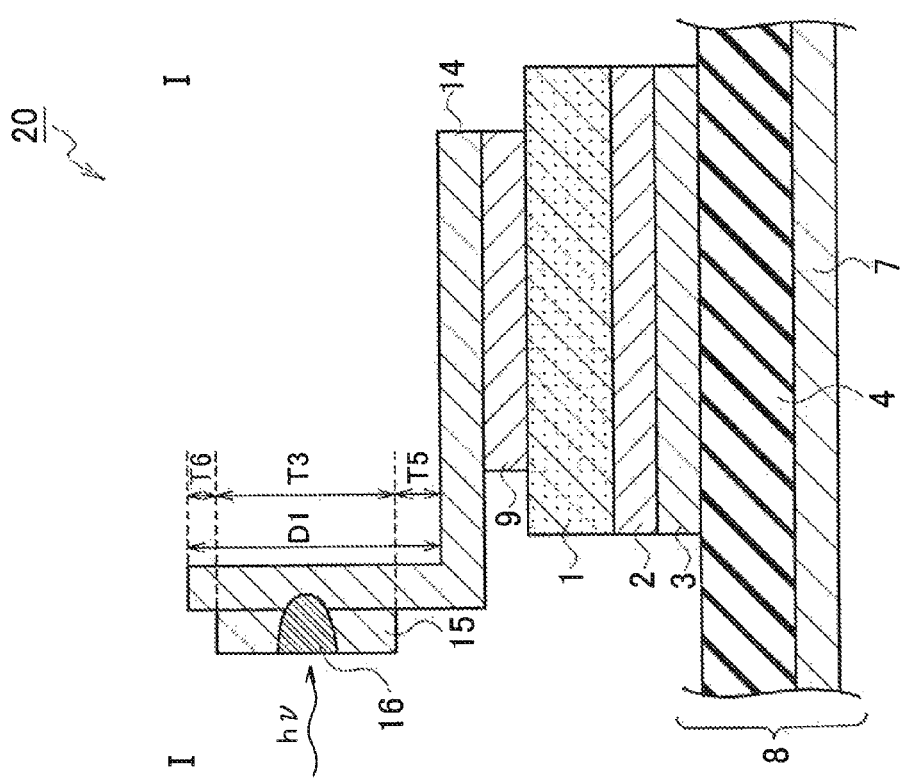
FIG. 12B is a schematic cross-sectional structure diagram taken in the line II-II of FIG. 9.

FIG. 9 shows a schematic planar pattern configuration of the power module 20 according to the first embodiment, and FIG. 10 shows a side view diagram observed from the direction IA-IA. Moreover, FIG. 11 shows another side view diagram observed from the direction IA-IA. Furthermore, FIG. 12A shows a schematic cross-sectional structure taken in line I-I, and FIG. 12B shows a schematic cross-sectional structure taken in the line II-II.

As shown in FIGS. 9-12, the power module 20 according to the first embodiment includes: a first metallic circuit pattern 3; a semiconductor device 1 disposed on the first metallic circuit pattern 3; a leadframe 15 electrically connected to the semiconductor device 1; a stress buffering layer 14 disposed on an upper surface of the semiconductor device 1, and capable of buffering the CTE difference between the semiconductor device 1 and the leadframe 15. In the present embodiment, the leadframe 15 is connected to the semiconductor device 1 via the stress buffering layer 14, the CTE of the stress buffering layer 14 is equal to or less than the CTE of the leadframe 15, and a cross-sectional shape of the stress buffering layer 14 is L-shape.

In the present embodiment, the first metallic circuit pattern 3 is formed of a surface copper foil disposed on the ceramics substrate 4. Moreover, a back surface copper foil 7 is formed on a back side surface of the ceramics substrate 4. The insulating circuit substrate 8 formed of a Direct Bonding Copper (DBC) substrate is composed of the surface copper foils 3, 6/the ceramics substrate 4/the back surface copper foil 7. Moreover, a Direct Brazed Aluminum (DBA) substrate or an Active Metal Brazed, Active Metal Bond (AMB) substrate is applicable, as the insulating circuit substrate 8.

Moreover, the leadframe 15 and the stress buffering layer 14 are connected to each other on the L-shaped side surface of the stress buffering layer 14 in a direction vertical to the upper surface of the semiconductor device 1, as shown in FIG. 12.

Moreover, the stress buffering layer 14 and the leadframe 15 are bonded to each other at a welded portion 16 by laser welding, as shown in FIGS. 9-12. Moreover, the stress buffering layer 14 and the leadframe 15 may be bonded with spot welding.

The semiconductor device 1 is connected to the first metallic circuit pattern 3 via the bonding layer 2 under chip disposed on the first metallic circuit pattern 3. The bonding layer 2 under chip may be a soldering layer under chip, for example. Moreover, the electrical bonding between the surface of the first metallic circuit pattern 3 and the semiconductor device 1 may be implemented using firing silver. More specifically, firing silver, e.g. an Ag particle layer or an Ag nanoparticle layer, previously formed on the back surface electrode of the semiconductor device 1 may be applied as the bonding layer 2 under chip, as it is.

Moreover, the semiconductor device 1 is connected to the stress buffering layer 14 via the bonding layer 9 on chip. The bonding layer 9 on chip may be a soldering layer on chip, for example. Moreover, the electrical bonding between the semiconductor device 1 and the stress buffering layer 14 may be implemented using the firing silver. More specifically, firing silver, e.g. an Ag particle layer or an Ag nanoparticle layer, previously formed on the front surface electrode of the semiconductor device 1 may be applied as the bonding layer 9 on chip, as it is.

Moreover, the stress buffering layer 14 may be formed of covar or invar.

Moreover, the stress buffering layer 14 may be formed of an Fe—Ni based alloy or Ni—Mo—Fe based alloy. More specifically, in the power module 20 according to the first embodiment, as materials cheaper than such cladding materials of which the CTE is relatively low and the melting point is relatively low, there may be used Fe—Ni based alloys, e.g. covar (the CTE is $5 \times 10^{-6}$/K and the melting point is 1450 degrees C.) and invar (the CTE is 0 $5 \times 10^{-6}$/K to $2 \times 10^{-6}$/K and the melting point is 1425 degrees C.), and Ni—Mo—Fe based alloys, e.g. hastelloy B2 (the CTE is $10.8 \times 10^{-6}$/K and the melting points are 1302 degrees C. to 1368 degrees C.), for example, instead of using expensive materials such as Cu/CuMo cladding or Cu/CuW cladding as the stress buffering layer 14.

Moreover, the power module 20 according to the first embodiment may include a second metallic circuit pattern 6 connected to the leadframe 15, as shown in FIGS. 9 and 10.

In the present embodiment, the leadframe 15 and the second metallic circuit pattern 6 are bonded to each other at a welded portion 17 by laser welding, as shown in FIGS. 9 and 10. Moreover, the stress buffering layer 14 and the leadframe 15 may be bonded with spot welding.

The laser applicable for a fabricating technology of the power module according to the first embodiment is second harmonics of a YAG laser or YAG laser, a YLF laser, a $YVO_4$ laser, a KrF laser, a $CO_2$ laser, or a CO laser, for example. Since the reflectance R is as high as approximately 90% in the wavelength (1064 nm) of the YAG laser if the YAG laser is directly applied to the welding on the surface of Cu, the Cu surface may be subjected to Ni plating when using the YAG laser (wavelength $\lambda$=1064 nm) for the fabricating technology of the power module according to the first embodiment. Moreover, the surface of Cu may be oxidized.

The power module 20 according to the first embodiment may include a ceramics substrate 4 as shown in FIGS. 9 and 10, and the first metallic circuit pattern 3 may be disposed on the ceramics substrate 4. More specifically, the first metallic circuit pattern 3 is formed of a surface copper foil disposed on the ceramics substrate 4, and a back surface copper foil 9 is formed on a back side surface of the ceramics substrate 4. The insulating circuit substrate 8 using the DBC substrate is composed of the surface copper foil 3/the ceramics substrate 4/the back surface copper foil 7. Moreover, the second metallic circuit pattern 6 is disposed on the ceramics substrate 4 in the same manner as the first metallic circuit pattern 3.

Moreover, the power module 20 according to the first embodiment may include an insulation layer substrate 40 as shown in FIGS. 9 and 11, and the first metallic circuit pattern 3 may be disposed on the insulation layer substrate 40. Moreover, the second metallic circuit pattern 6 may be disposed on the insulation layer substrate 40 in the same manner as the first metallic circuit pattern 3. In the present embodiment, the insulation layer substrate 40 may be formed of an organic insulating resin layer, for example.

Figure 18:
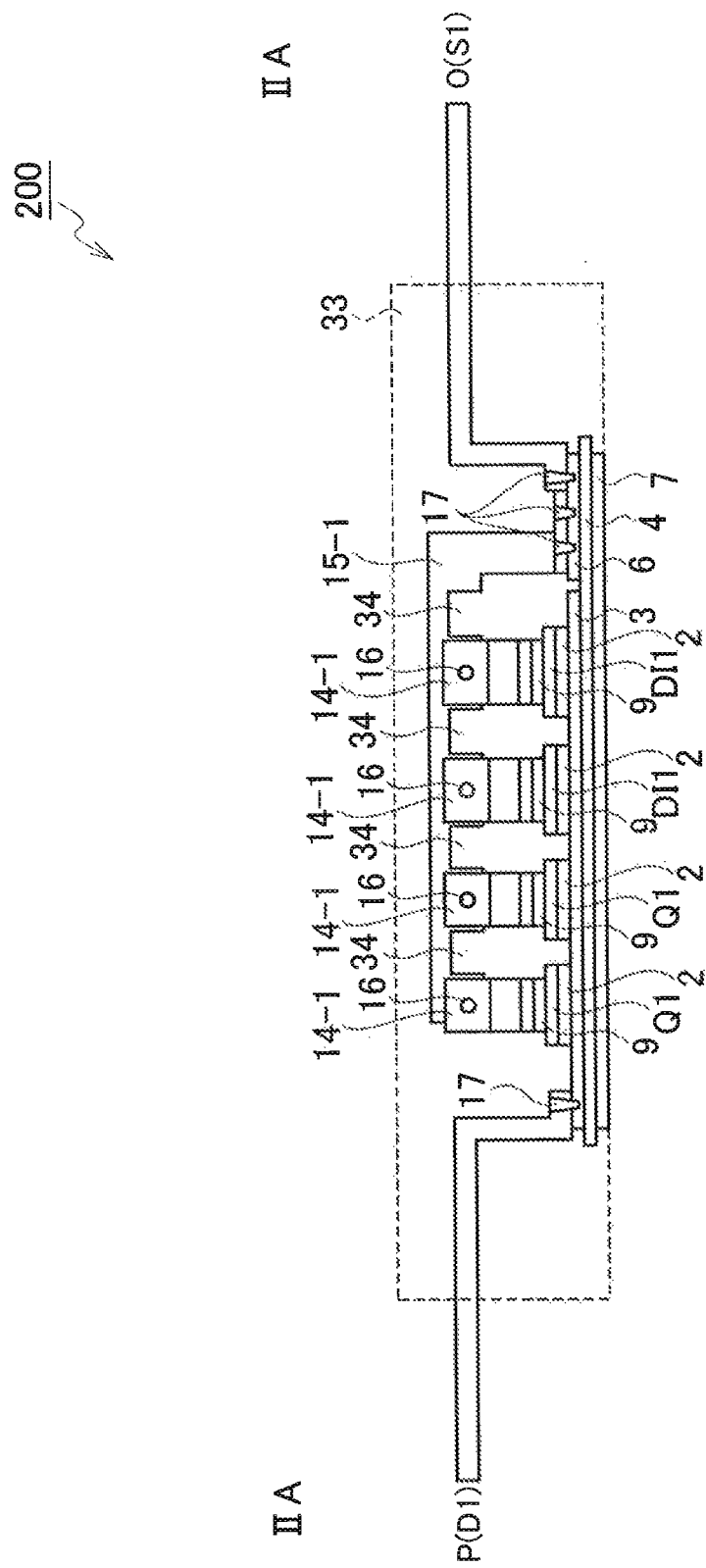
FIG. 18 is a side view diagram observed from the direction IIA-IIA in FIG. 16.
Figure 19:
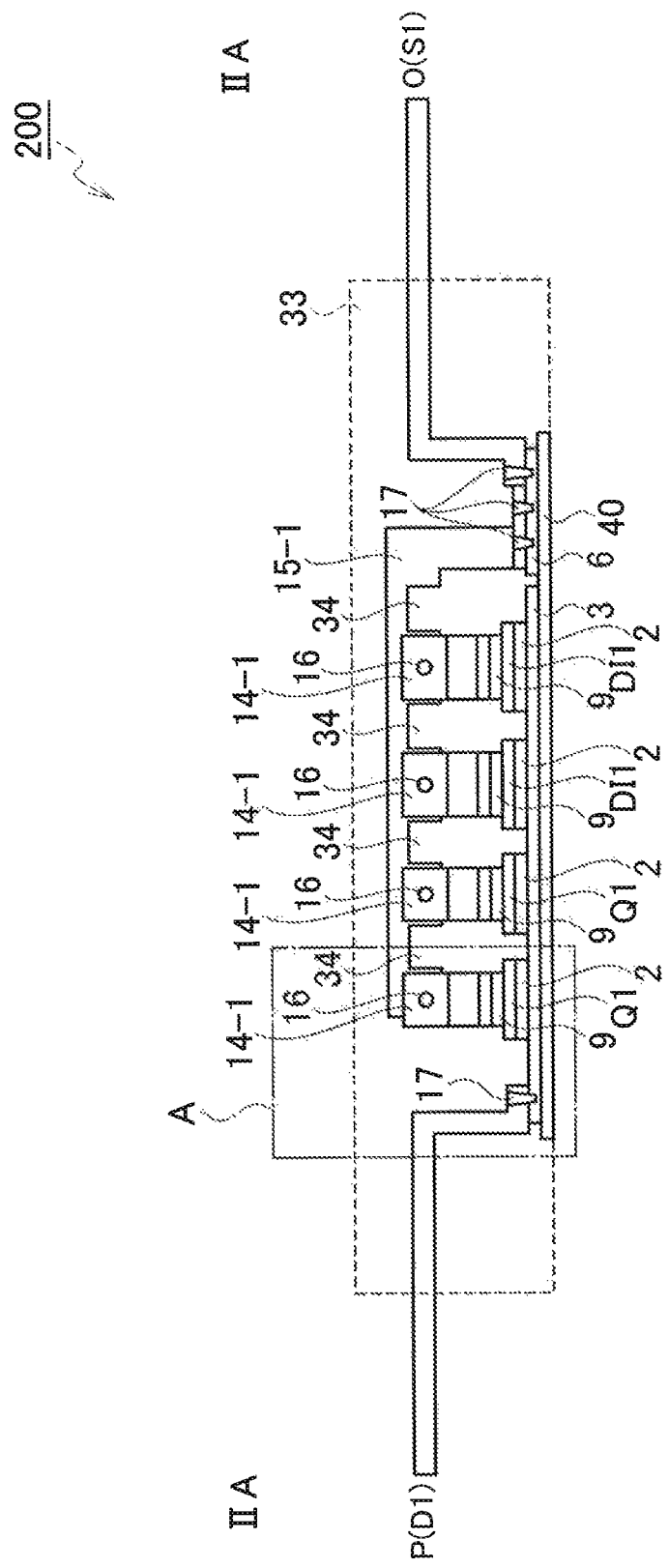
FIG. 19 is a side view diagram observed from the direction IIA-IIA in FIG. 16, in a power module according to a modified example of the third embodiment.

The welded portion 16 is irradiated with the laser applicable for the fabricating technology of the power module 20 according to the first embodiment via a window for laser light radiation (34: refer to FIGS. 18 and 19, for example). The window for laser light radiation 34 should just be a spatial space in which the welded portion 16 can be irradiated with the laser light hv. The direction of radiation of the laser light by is a direction vertical to the surface of the leadframe 15 disposed on the side surface of the stress buffering layer 14 having L-shaped structure, in FIGS. 12A and 12B, for example.

As shown in FIGS. 12A and 12B, a raised height of the stress buffering layer 14 in the L-shaped structure is denoted by D1 in the inside portion. On the other hand, the width (the length in the height direction) of the leadframe 15 disposed on the side surface of the stress buffering layer 14 is denoted by T3. The width T3 of the leadframe 15 is within the range of the raised height D1 of the stress buffering layer 14, in the structure example of FIG. 12A. On the other hand, in the structure example of FIG. 12B, the width T3 of the leadframe 15 is partially within the range of the raised height D1 of the stress buffering layer 14. However, since the raised portion of the leadframe 15 and the stress buffering layer 14 are overlapped with a portion of D1-T2 in the example of FIG. 12B, the laser welding between the leadframe 15 and the stress buffering layer 14 can be realized if the overlapped portion is irradiated with the laser light hv, as shown in FIG. 12B.

Thus, according to the power module 20 according to the first embodiment, in the case where the plurality of chips (semiconductor devices 1) are arranged in parallel, even if a variation in thickness occur in the layered structure of the first metallic circuit pattern 3/the bonding layer 2 under chip/the semiconductor device 1/the bonding layer 9 on chip/the stress buffering layer 14 having L-shaped structure, the variation in the thickness of the above-mentioned layered portion can be absorbed in the overlapped portion between the side surface of the L-shaped-structured stress buffering layer 14 and the leadframe 15, as shown in FIGS. 12A and 12B.

Moreover, in the power module 20 according to the first embodiment, as shown in FIGS. 12A and 12B, the bonded portion is extended in the side surface direction of the semiconductor device 1 using the L-shaped cramp, for example, in order to perform the laser welding of the leadframe 15 thereon, instead of providing the bonded portion between the stress buffering layer 14 and the leadframe 15 directly above the semiconductor device 1. Accordingly, even if there is a variation in the laser welding (variation in the amount of penetration), the semiconductor device 1 is not damaged, thereby improving yields.

In the power module 20 according to the first embodiment, the point of bonding the stress buffering layer 14 on the semiconductor device 1 is same as that of the comparative example. However, this differs from the power module 20A according to the comparative example in that the shape of the stress buffering layer 14 is flat, but is L-shape. Furthermore, the leadframe 15 including Cu, a Cu alloy, aluminum, or an aluminum alloy is welded to the L-shaped stress buffering layer 14. Since the welded portion 16 is not disposed directly above the semiconductor device 1, a chip damage due to the welding variation in bonding formation by the laser welding is avoidable. Spot welding is also applicable thereto instead of the laser welding.

Furthermore, according to the power module according to the first embodiment, since no bonding wire is used for main wiring, Ag sintered materials can be used as the bonding materials, and thereby it becomes possible to operate the SiC semiconductor device at high temperature, e.g., around 300 degrees C.

(Fabrication Method)

A fabrication method for the power module 20 according to the first embodiment includes: forming a first metallic circuit pattern 3; forming a semiconductor device 1 on the first metallic circuit pattern 3; forming a stress buffering layer 14 of which a cross-sectional shape is L-shape on an upper surface of the semiconductor device 1; and connecting a leadframe 15 to the stress buffering layer 14 at an L-shaped side surface of the stress buffering layer 14 in a direction vertical to the upper surface of the semiconductor device 1. In the present embodiment, a CTE of the stress buffering layer 14 is equal to or less than a CTE of the leadframe 15, and the stress buffering layer 14 can buffer the CTE difference between the semiconductor device 1 and the leadframe 15.

Moreover, the step of connecting the leadframe 15 to the stress buffering layer 14 is implemented by laser welding. Moreover, the step of connecting the leadframe 15 to the stress buffering layer 14 may also be implemented by spot welding.

Furthermore, the fabrication method may include: forming a second metallic circuit pattern 6; and connecting the leadframe 15 to the second metallic circuit pattern 6.

In the present embodiment, the step of connecting the leadframe 15 to the second metallic circuit pattern 6 is implemented by laser welding. Moreover, the step of connecting the leadframe 15 to the second metallic circuit pattern 6 may be also implemented by spot welding.

Moreover, the fabrication method for the power module 20 according to the first embodiment may include: preparing a substrate; and disposing the first metallic circuit pattern 3 on the substrate. The fabrication method may further include disposing the second metallic circuit pattern 6 on the substrate.

Moreover, the fabrication method for the power module 20 according to the first embodiment may include: preparing an insulation layer substrate 40; and disposing the first metallic circuit pattern 3 on the insulation layer substrate 40. The fabrication method may further include disposing the second metallic circuit pattern 6 on the insulation layer substrate 40.

Modified Example 1

In a power module 20 according to a modified example 1 of the first embodiment, FIG. 13A shows a schematic cross-sectional structure of a layered structure of a ceramics substrate 4/a first metallic circuit pattern 3/a bonding layer 2 under chip/a semiconductor device 1/a bonding layer 9 on chip/a stress buffering layer 14 having L-shaped structure. FIG. 13B shows a schematic cross-sectional structure of a portion of which thicknesses of the above-mentioned layered structure are different from one another. Herein, FIG. 13A corresponds to a schematic cross-sectional structure corresponding to FIG. 12A expressing the schematic cross-sectional structure taken in the line I-I of FIG. 9, and FIG. 13B corresponds to a schematic cross-sectional structure corresponding to FIG. 12B expressing the schematic cross-sectional structure taken in the line II-II of FIG. 9.

In the power module 20 according to the modified example 1 of the first embodiment, as shown in FIGS. 13A and 13B, the leadframe 15 is disposed on the raised side surface inside the L-shaped structure of the stress buffering layer 14, and is bonded at the welded portion 16 by laser welding.

More specifically, in the first embodiment, the welded portion 16 is extracted in a side surface direction of the semiconductor device 1 using the stress buffering layer 14 having L-shaped structure, and then the leadframe 15 is laser-welded hereto. On the other hand, in the power module 20 according to the modified example 1 of the first embodiment, the leadframe 15 is laser-welded to the raised side surface inside the L-shaped structure of the stress buffering layer 14.

The welded portion 16 is irradiated with the laser light applicable to the fabricating technology of the power module 20 according to the modified example 1 of the first embodiment, via a window for laser light radiation. The window for laser light radiation should just be a spatial space in which the welded portion 16 can be irradiated with the laser light hv. The direction of radiation of the laser light hv is a direction vertical to the surface of the leadframe 15 disposed on the raised side surface inside the stress buffering layer 14 having L-shaped structure in FIGS. 13A and 13B, for example.

Modified Example 2

In a power module 20 according to a modified example 2 of the first embodiment, FIG. 14A shows a schematic cross-sectional structure of a layered structure of a ceramics substrate 4/a first metallic circuit pattern 3/a bonding layer 2 under chip/a semiconductor device 1/a bonding layer 9 on chip/a stress buffering layer 14 having L-shaped structure. FIG. 14B shows a schematic cross-sectional structure of a portion of which thicknesses of the above-mentioned layered structure are different from one another. Herein, FIG. 14A corresponds to a schematic cross-sectional structure corresponding to FIG. 12A expressing the schematic cross-sectional structure taken in the line I-I of FIG. 9, and FIG. 14B corresponds to a schematic cross-sectional structure corresponding to FIG. 12B expressing the schematic cross-sectional structure taken in the line II-II of FIG. 9.

In the power module 20 according to the modified example 2 of the first embodiment, as shown in FIGS. 14A and 14B, the leadframe 15 is disposed on the raised side surface inside the L-shaped structure of the stress buffering layer 14, and is bonded at the welded portion 16 by laser welding.

In the power module 20 according to the modified example 1 of the first embodiment, the leadframe 15 is laser-welded to the raised side surface inside the L-shaped structure of the stress buffering layer 14. On the other hand, in the modified example 2 of the first embodiment, the leadframe 15 laser-welded to the inner side surface of the stress buffering layer 14 having L-shaped structure is disposed further inside in the side surface direction of the semiconductor device 1 as compared with the modified example 1 of the first embodiment.

According to the first embodiment and its modified examples, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

Second Embodiment

A power module 20 according to a second embodiment includes structure of inserting materials having relatively low CTE, between the semiconductor device 1 and the leadframe 15, as a stress buffering layer 14 for buffering of the CTE difference between the semiconductor device 1 and the leadframe 15, in the power module in which the semiconductor device 1 is installed on a surface thereof, and the leadframe 15 is bonded to an upper surface of the semiconductor device 1, as shown in FIG. 15. In the present embodiment, the CTE of the stress buffering layer 14 is equal to or less than the CTE of the leadframe 15, and a shape of the stress buffering layer 14 is U-shape.

Figure 15A:
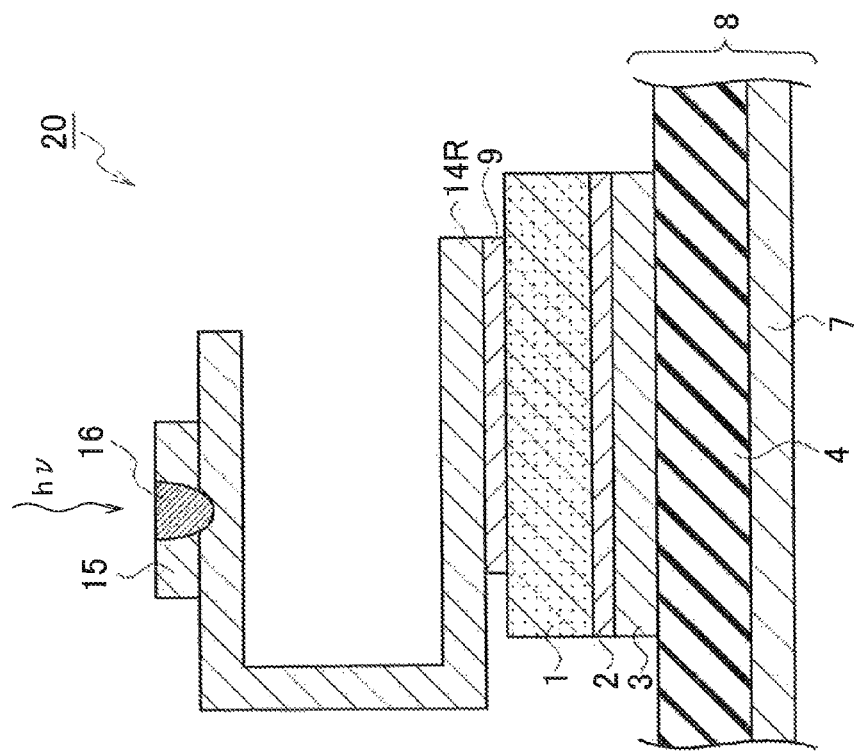
FIG. 15A is a schematic cross-sectional structure diagram of layered structure of a ceramics substrate/first metallic circuit pattern/bonding layer under chip/semiconductor device/bonding layer on chip/U-shaped stress buffering layer, in a power module according to a second embodiment.
Figure 15B:
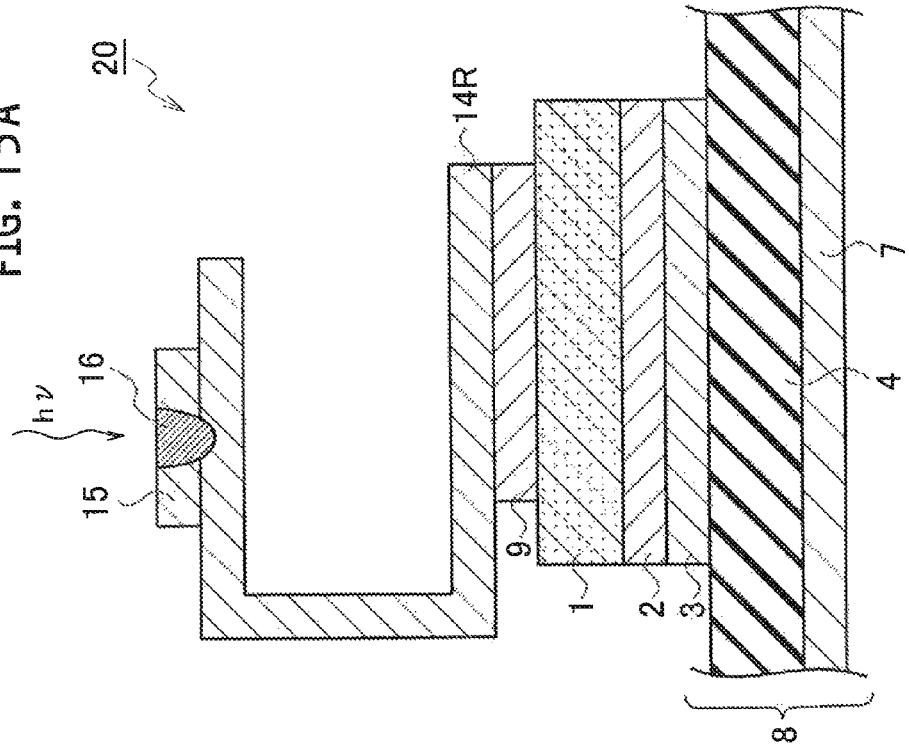
FIG. 15B is a schematic cross-sectional structure diagram of a portion from which the thicknesses are different from one another in the above-mentioned layered structure, in the power module according to the second embodiment.

In the power module 20 according to the second embodiment, FIG. 15A shows a schematic cross-sectional structure of a layered structure of a ceramics substrate 4/a first metallic circuit pattern 3/a bonding layer 2 under chip/a semiconductor device 1/a bonding layer 9 on chip/a stress buffering layer 14R having U-shaped structure. FIG. 15B shows a schematic cross-sectional structure of a portion of which thicknesses of the above-mentioned layered structure are different from one another. Herein, FIG. 15A corresponds to a schematic cross-sectional structure corresponding to FIG. 12A expressing the schematic cross-sectional structure taken in the line I-I, in the power module 20 according to the first embodiment (FIG. 9), and FIG. 15B corresponds to a schematic cross-sectional structure corresponding to FIG. 12B expressing the schematic cross-sectional structure taken in the line II-II of FIG. 9.

In the power module 20 according to the second embodiment, as shown in FIGS. 15A and 15B, the leadframe 15 is isolated from the upper surface of the semiconductor device 1, and is disposed on the U-shaped side surface of the stress buffering layer 14R in a direction parallel to the upper surface of the semiconductor device 1, and then is bonded at the welded portion 16 by laser welding.

The welded portion 16 is irradiated with the laser light applicable to the fabricating technology of the power module 20 according to the second embodiment, via a window for laser light radiation. The window for laser light radiation should just be a spatial space in which the welded portion 16 can be irradiated with the laser light hv. The direction of radiation of the laser light hv is a direction vertical to the surface of the leadframe 15 disposed on outside the U-shaped side surface of the stress buffering layer 14R having U-shaped structure, for example, in FIGS. 15A and 15B.

As shown in FIGS. 15A and 15B, the power module 20 according to the second embodiment includes: a first metallic circuit pattern 3; a semiconductor device 1 disposed on the first metallic circuit pattern 3; a leadframe 15 electrically connected to the semiconductor device 1; and a stress buffering layer 14R disposed on an upper surface of the semiconductor device 1, and capable of buffering a coefficient of thermal expansion (CTE) difference between the semiconductor device 1 and the leadframe 15. In the present embodiment, the leadframe 15 is connected to the semiconductor device 1 via the stress buffering layer 14R, the CTE of the stress buffering layer 14R is equal to or less than the CTE of the leadframe 15, and a cross-sectional shape of the stress buffering layer 14R is U-shape.

Moreover, the leadframe 15 and the stress buffering layer 14R are isolated from the upper surface of the semiconductor device 1, and are connected on the U-shaped side surface of the stress buffering layer 14R in a direction parallel to the upper surface of the semiconductor device 1.

Moreover, the stress buffering layer 14R and the leadframe 15 are bonded to each other at a welded portion 16 by laser welding, as shown in FIGS. 15A and 15B. Moreover, the stress buffering layer 14 and the leadframe 15 may be bonded with spot welding.

In the power module 20 according to the second embodiment, there may be used Fe—Ni based alloys, e.g. covar (the CTE is $5 \times 10^{-6}$/K and the melting point is 1450 degrees C.) and invar (the CTE is $0.5 \times 10^{-6}$/K to $2 \times 10^{-6}$ 6/K and the melting point is 1425 degrees C.), and Ni—Mo—Fe based alloys, e.g. hastelloy B2 (the CTE is $10.8 \times 10^{-6}$/K and the melting points are 1302 degrees C. to 1368 degrees C.), for example, instead of using expensive materials such as Cu/CuMo cladding or Cu/CuW cladding as the stress buffering layer 14R.

The laser applicable for a fabricating technology of the power module according to the second embodiment is second harmonics of a YAG laser or YAG laser, a YLF laser, a $YVO_4$ laser, a KrF laser, a $CO_2$ laser, or a CO laser, for example.

Moreover, in the power module 20 according to the second embodiment, the laser welding is applied to the surface of the leadframe 15 disposed on outside the U-shaped side surface of the stress buffering layer 14R having U-shaped structure, as shown in FIGS. 15A and 15B, instead of providing the bonded portion between the stress buffering layer 14 and the leadframe 15 directly above the semiconductor device 1. Accordingly, even if there is a variation in the laser welding (variation in the amount of penetration), the semiconductor device 1 is not damaged, thereby improving yields. Moreover, it is also possible to achieve high intensity due to a spring effect produced from the U-shaped structure by using the stress buffering layer 14R having U-shaped structure.

In the power module 20 according to the second embodiment, the point of bonding the stress buffering layer 14 on the semiconductor device 1 is same as the comparative example. However, this differs from the power module 20A according to the comparative example in that the shape of the stress buffering layer 14 is flat, but is U-shape. Furthermore, the leadframe 15 including Cu, a Cu alloy, aluminum, or an aluminum alloy is welded to the U-shaped stress buffering layer 14. Since the welded portion 16 is not disposed directly above the semiconductor device 1, a chip damage due to the welding variation in bonding formation by the laser welding is avoidable. Spot welding is also applicable thereto instead of the laser welding.

Furthermore, according to the power module according to the second embodiment, since no bonding wire is used for main wiring, Ag sintered materials can be used as the bonding materials, and thereby it becomes possible to operate the SiC semiconductor device at high temperature, e.g., around 300 degrees C.

According to the power module according to the second embodiment, since no expensive stress buffer materials are used, a cost of the module can be reduced.

According to the power module according to the second embodiment, a yield can be improved since it is the structure where the laser welding is not implemented directly above the semiconductor device.

(Fabrication Method)

A fabrication method for the power module 20 according to the second embodiment includes: forming a first metallic circuit pattern 3; forming a semiconductor device 1 on the first metallic circuit pattern 3; forming a stress buffering layer 14 of which a cross-sectional shape is U-shape on an upper surface of the semiconductor device 1; and connecting a leadframe 15 to the stress buffering layer 14R at a U-shaped side surface of the stress buffering layer 14R isolated from the upper surface of the semiconductor device 1 in a direction parallel to the upper surface of the semiconductor device 1. In the present embodiment, a CTE of the stress buffering layer 14R is equal to or less than a CTE of the leadframe 15, and the stress buffering layer 14R can buffer a coefficient of thermal expansion (CTE) difference between the semiconductor device 1 and the leadframe 15.

Moreover, the step of connecting the leadframe 15 to the stress buffering layer 14R is implemented by laser welding. Moreover, the step of connecting the leadframe 15 to the stress buffering layer 14R may be also implemented by spot welding.

Moreover, the fabrication method for the power module 20 according to the second embodiment may include: preparing a substrate; and disposing the first metallic circuit pattern 3 on the substrate.

Moreover, the fabrication method for the power module 20 according to the second embodiment may include: preparing an insulation layer substrate 40; and disposing the first metallic circuit pattern 3 on the insulation layer substrate 40.

According to the second embodiment, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

Third Embodiment

Figure 16:
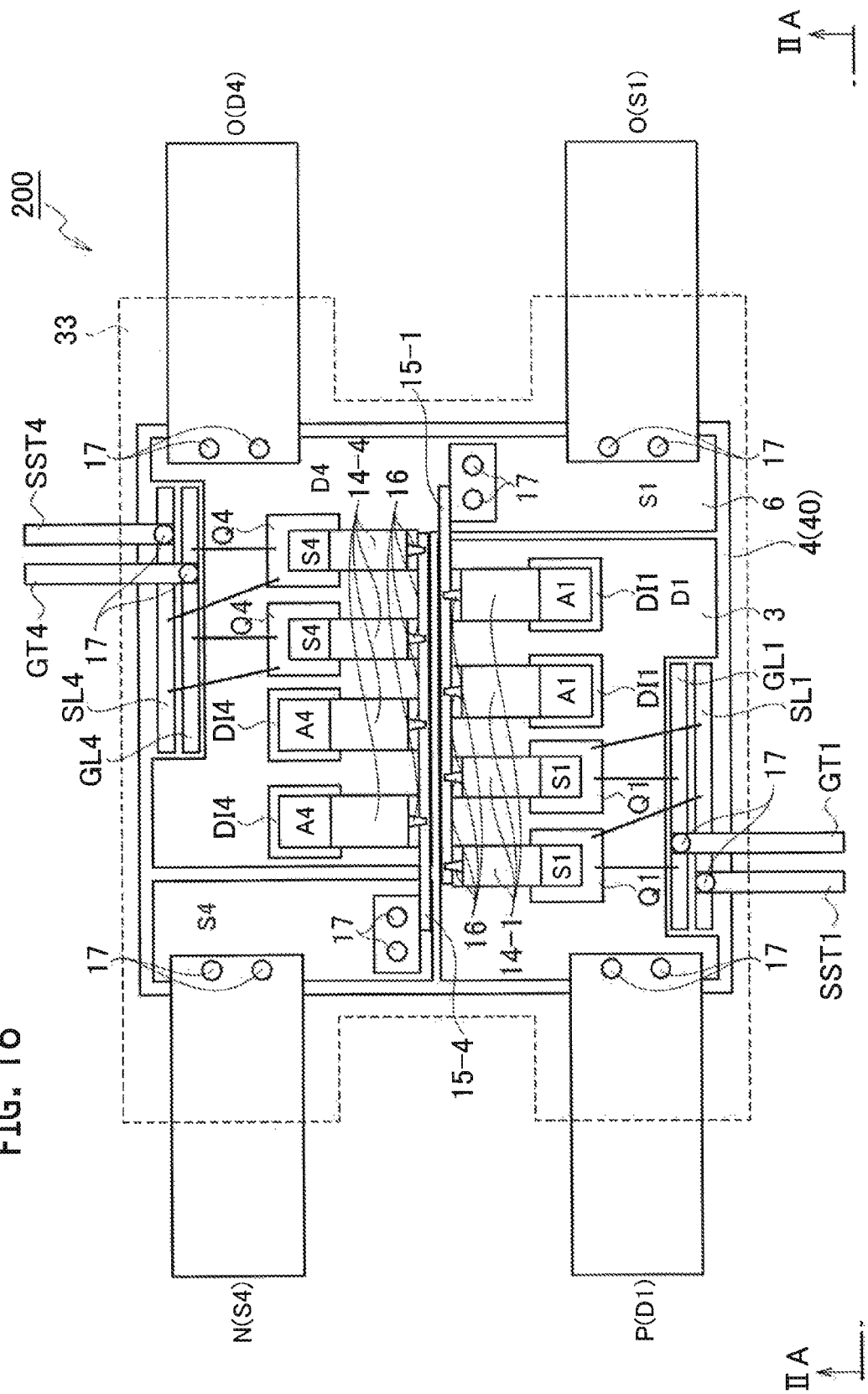
FIG. 16 is a schematic planar pattern configuration diagram before forming a mold resin layer in a 2-in-1 module (module with a built-in half-bridge), in a power module according to a third embodiment.

FIG. 16 shows a schematic planar pattern configuration before forming a mold resin layer 33 in a 2-in-1 module (module with a built-in half-bridge), in a power module 200 according to a third embodiment. In the present embodiment in FIG. 16, a substrate 4 corresponds to a ceramics substrate, and a substrate 40 corresponds to the insulation layer substrate (FIG. 19) as the modified example.

Figure 17:
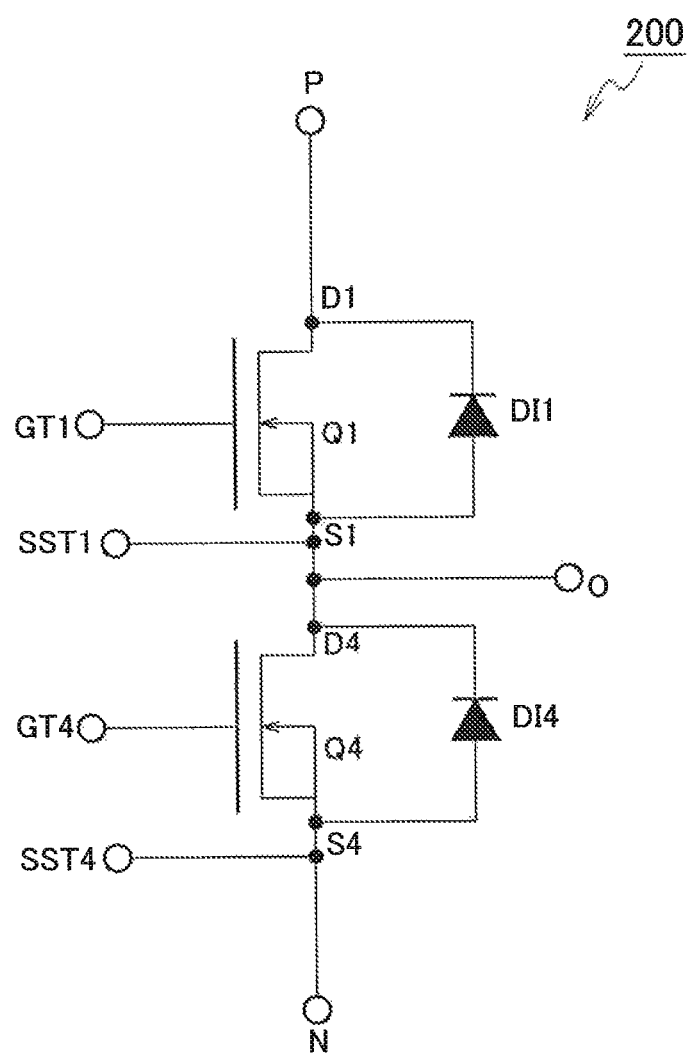
FIG. 17 is a circuit configuration diagram of the 2-in-1 module (module with the built-in half-bridge) in which an SiC Metal Oxide Semiconductor Field Effect Transistor (MISFET) is applied as a semiconductor device, in the power module according to the third embodiment.

Moreover, FIG. 17 shows a circuit configuration of the 2-in-1 module (module with a built-in half-bridge) corresponding to FIG. 16 to which SiC MISFET is applied as a semiconductor device, in the power module according to the third embodiment. FIG. 18 shows a side view diagram observed from the direction IIA-IIA in FIG. 16.

Figure 21:
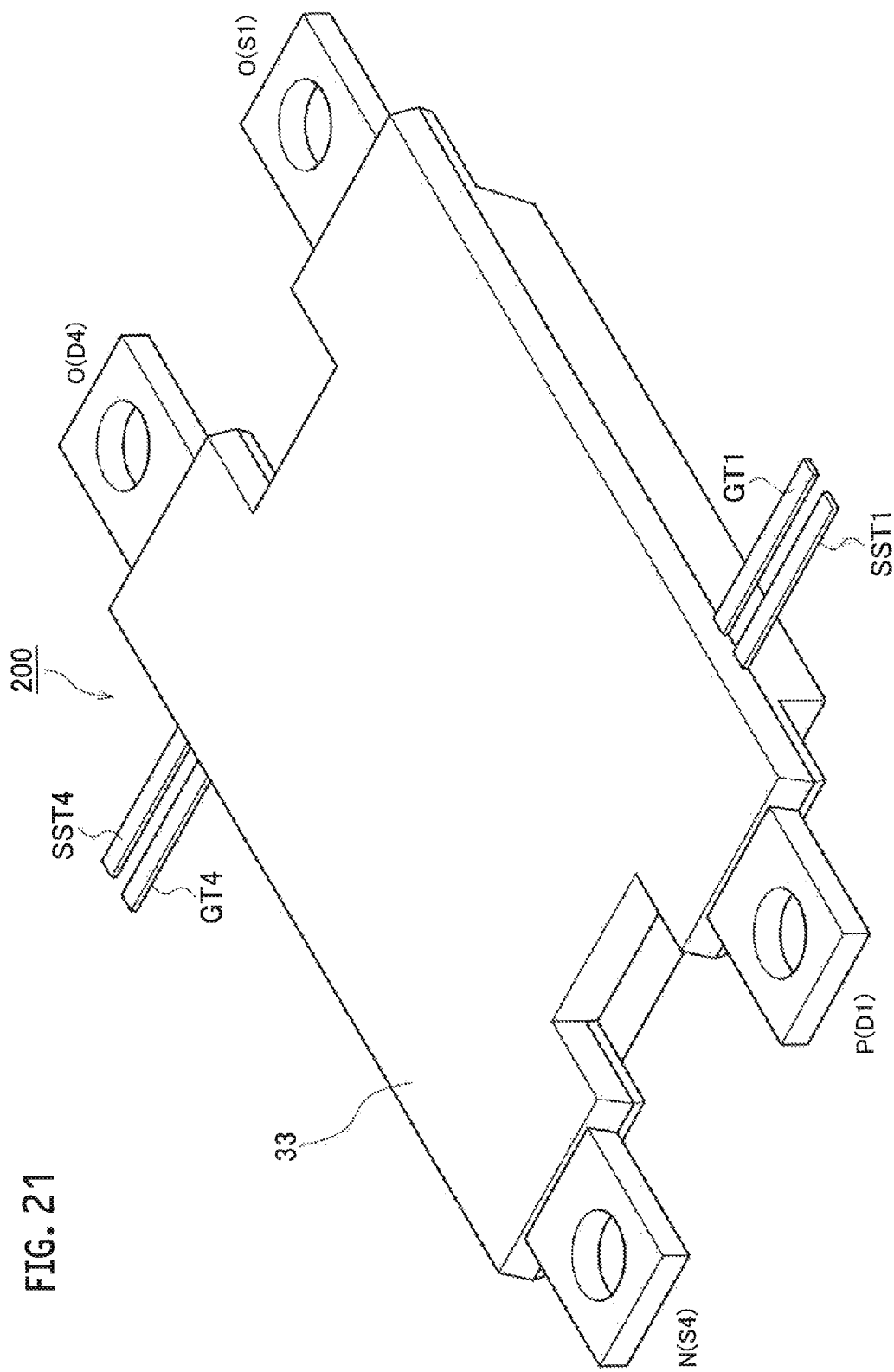
FIG. 21 is a schematic bird's-eye view configuration diagram after forming the mold resin layer in the module with a built-in half-bridge, in the power module according to the third embodiment.

FIG. 21 shows a schematic bird's-eye view configuration after forming the mold resin layer 33 in the module with a built-in half-bridge, in the power module 200 according to the third embodiment. The power module 200 according to the third embodiment includes the mold resin layer 33, and the power module may be transfer-molded with the mold resin layer 33.

The power module 200 according to the third embodiment includes a configuration of a module with the built-in half-bridge in which two MISFETs Q1, Q4 are built in one module. As shown in FIG. 16, 2 chips of the MISFETs Q1, Q4 are respectively disposed in parallel, and 2 chips of diodes DI1, DI4 are respectively also disposed in parallel. The diodes DI1, DI4 are respectively connected reversely in parallel between D1 and S1 and between D4 and S4 of the MISFETs Q1, Q4.

As is shown in FIGS. 16 and 21, the power module 200 according to the third embodiment includes: a positive-side power terminal P and a negative-side power terminal N disposed at a first side of a substrate 4 (40) covered with a mold resin layer 33; a gate terminal GT1 and a source sense terminal SST1 disposed at a second side adjacent to the first side; an output terminal O disposed at a third side opposite to the first side; and a gate terminal GT4 and a source sense terminal SST4 disposed at a fourth side opposite to the second side. In the present embodiment, as shown in FIG. 16, the gate terminal GT1 and the source sense terminal SST1 are connected to the signal wiring pattern GL1 for gate and the signal wiring pattern SL1 for source in the MISFET Q1; and the gate terminal GT4 and the source sense terminal SST4 are connected to the signal wiring pattern GL4 for gate and the signal wiring pattern SL4 for source in the MISFET Q4.

A wire for gate and a wire for source sense are connected towards the signal wiring patterns GL1, GL4 for gate and the signal wiring patterns SL1, SL4 for source sense from the MISFETs Q1, Q4. Moreover, gate terminals GT1, GT4 and SST1, SST4 for external extraction are connected to the signal wiring patterns GL1, GL4 for gate and the signal wiring patterns SL1, SL4 for source sense by soldering etc.

The positive-side power terminal P and the negative-side power terminal N, and the gate terminals GT1, GT4 and SST1, SST4 for external extraction can be formed of Cu, for example.

The ceramic substrate 4 may be formed of $Al_2O_3$, AlN, SiN, AlSiC, or SiC of which at least the surface is insulation, for example.

The first metallic circuit pattern 3 and the second metallic circuit pattern 6 can be formed of Cu, Al, etc., for example. The wire for gate and the wire for source sense can be formed of Al, AlCu, etc., for example.

SiC based power devices, e.g. SiC DIMISFET and SiC TMISFET, or GaN based power devices, e.g. GaN based High Electron Mobility Transistor (HEMT), are applicable as the MISFETs Q1, Q4. In some instances, power devices, e.g. Si based MISFETs and IGBT, are also applicable thereto.

An SiC Schottky Barrier Diode (SBD) can be applied to the diodes D1 and D4, for example.

As shown in FIGS. 16 and 18, the power module 200 according to the third embodiment includes: a first metallic circuit pattern 3; semiconductor devices Q1, DI1 disposed on the first metallic circuit pattern 3; a leadframe 15-1 electrically connected to the semiconductor devices Q1, DI1; and a stress buffering layer 14-1 disposed on an upper surface of the semiconductor devices Q1, DI1, and capable of buffering a CTE difference between the semiconductor devices Q1, DI1 and the leadframe 15-1. In the present embodiment, the leadframe 15-1 is connected to the semiconductor devices Q1, DI1 via the stress buffering layer 14-1, the CTE of the stress buffering layer 14-1 is equal to or less than the CTE of the leadframe 15-1, and a cross-sectional shape of the stress buffering layer 14-1 is L-shape.

Moreover, the leadframe 15-1 and the stress buffering layer 14-1 are connected to each other on the L-shaped side surface of the stress buffering layer 14-1 in a direction vertical to the upper surface of the semiconductor devices Q1, DI1, as shown in FIGS. 16 and 18.

Moreover, the stress buffering layer 14-1 and the leadframe 15-1 are bonded to each other at a welded portion 16 by laser welding, as shown in FIGS. 16 and 18. Moreover, the stress buffering layer 14-1 and the leadframe 15-1 may be bonded with spot welding.

The semiconductor devices Q1, DI1 are connected to the first metallic circuit pattern 3 via the bonding layer 2 under chip disposed on the first metallic circuit pattern 3. The bonding layer 2 under chip may be a soldering layer under chip, for example. Moreover, the electrical bonding between the surface of the first metallic circuit pattern 3 and the semiconductor devices Q1, DI1 may be implemented using firing silver. More specifically, firing silver, e.g. an Ag particle layer or an Ag nanoparticle layer, previously formed on the back surface electrode of the semiconductor devices Q1, DI1 may be applied as the bonding layer 2 under chip, as it is.

Moreover, the semiconductor devices Q1, DI1 are connected to the stress buffering layer 14-1 via the bonding layer 9 on chip. The bonding layer 9 on chip may be a soldering layer on chip, for example. Moreover, the electrical bonding between the semiconductor devices Q1, DI1 and the stress buffering layer 14-1 may be implemented using the firing silver. More specifically, firing silver, e.g. an Ag particle layer or an Ag nanoparticle layer, previously formed on the front surface electrode of the semiconductor devices Q1, DI1 may be applied as the bonding layer 9 on chip, as it is.

Moreover, the stress buffering layer 14-1 may be formed of covar or invar. Moreover, the stress buffering layer 14-1 may be formed of a Fe—Ni based alloy or Ni—Mo—Fe based alloy.

Moreover, the power module 200 according to the third embodiment may include a second metallic circuit pattern 6 connected to the leadframe 15-1, as shown in FIG. 16. In the present embodiment, the leadframe 15-1 and the second metallic circuit pattern 6 are bonded to each other by the laser welding at a welded portion 17, as shown in FIG. 16. Moreover, the leadframe 15-1 and the second metallic circuit pattern 6 may be bonded with spot welding.

Moreover, in the power module 200 according to the third embodiment, the positive-side power terminal P(D1), the negative-side power terminal N(S4), and the output terminals O(D4), O(S1) are bonded by laser welding in a welded portion 17, as shown in FIG. 16. Moreover, the positive-side power terminal P(D1), the negative-side power terminal N(S4), and the output terminals O(D4), O(S1) may be bonded with spot welding.

As shown in FIG. 16, the power module 200 according to the third embodiment includes semiconductor devices Q4, DI4 disposed on the second metallic circuit pattern 6; a leadframe 15-4 electrically connected to the semiconductor devices Q4, DI4; and a stress buffering layer 14-4 disposed on an upper surface of the semiconductor devices Q4, DI4, and capable of buffering a CTE difference between the semiconductor devices Q4, DI4 and the leadframe 15-4. In the present embodiment, the leadframe 15-4 is connected to the semiconductor devices Q4, DI4 via the stress buffering layer 14-4, the CTE of the stress buffering layer 14-4 is equal to or less than the CTE of the leadframe 15-4, and a cross-sectional shape of the stress buffering layer 14-4 is L-shape. Other configurations are the same as those of the semiconductor devices Q1, DI1.

The laser applicable for a fabricating technology of the power module according to the third embodiment is second harmonics of a YAG laser or YAG laser, a YLF laser, a $YVO_4$ laser, a KrF laser, a $CO_2$ laser, or a CO laser, for example.

The power module 200 according to the third embodiment may include a ceramics substrate 4 as shown in FIGS. 16 and 18, and the first metallic circuit pattern 3 may be disposed on the ceramics substrate 4. Moreover, the second metallic circuit pattern 6 may also be disposed on the ceramics substrate 4 in the same manner as the first metallic circuit pattern 3.

(Window for Laser Light Radiation)

The welded portion 16 is irradiated with the laser light applicable to the fabricating technology of the power module 200 according to the third embodiment, via a window for laser light radiation. The window for laser light radiation should just be a spatial space in which the welded portion 16 can be irradiated with the laser light $h_v$. The direction of radiation of laser light hv is a direction vertical to an internal surface of the L-shaped stress buffering layer 14-1 bonded to the leadframe 15-1, in FIGS. 16 and 18. On the other hand, it may be irradiated with the laser light hv from a back side surface direction vertical to the leadframe 15-1 bonded to an external surface of the L-shaped stress buffering layer 14-1.

The window for laser light radiation 34 shown in FIG. 18 is opened in the leadframe 15-1. It may be irradiated with the laser light hv through the window for laser light radiation 34 from a back side surface direction vertical to the leadframe 15-4 bonded to an external surface of the L-shaped stress buffering layer 14-4.

In the power module 200 according to the third embodiment, the arm can be welded at the opposite side by providing the windows for laser light radiation 34 in the leadframes 15-1, 15-4. Moreover, as shown in FIG. 16, the leadframe 15-1 at the upper arm side and the leadframe 15-4 at the lower arm side are opposed to each other and disposed to be approximated to an opposed distance enough to secure an insulating breakdown voltage, and thereby a parasitic inductance of wiring can be reduced, and a surge voltage occurring at the time of switching can be reduced.

In the power module 200 according to the third embodiment, in the case where the plurality of chips (semiconductor devices 1) are arranged in parallel, even if a variation in thickness occur in the layered structure of the first metallic circuit pattern 3/the bonding layer 2 under chip/the semiconductor devices Q1, DI1, Q4, DI4/the bonding layer 9 on chip/the stress buffering layers 14-1, 14-4 having L-shaped structure, a variation in the thickness of the layered portion can be absorbed in an overlapped portion between the side surface of the L-shaped structure of the stress buffering layers 14-1, 14-4 and the leadframes 15-1, 15-4.

Moreover, in the power module 200 according to the third embodiment, as shown in FIGS. 16 and 18, the bonded portions between the stress buffering layers 14-1, 14-4 and the leadframes 15-1, 15-4 are not provided directly above the semiconductor devices Q1, DI1, Q4, DI4, but are extracted in the side surface direction of the semiconductor devices Q1, DI1, Q4, DI4 using an L-shaped cramp, and the leadframes 15-1, 15-4 are laser-welded hereto. Accordingly, even if there is a variation in the laser welding (variation in the amount of penetration), the semiconductor devices Q1, DI1, Q4, DI4 are not damaged, thereby improving yields.

Modified Example

Figure 20:
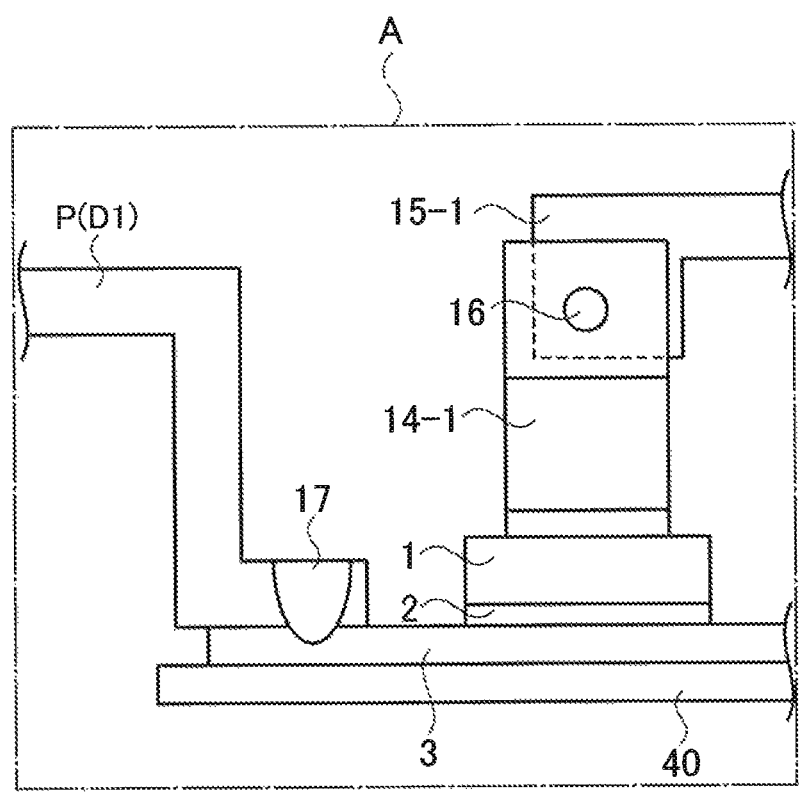
FIG. 20 is an enlarged drawing of the portion A shown in FIG. 19.

FIG. 19 is a side view diagram observed from the direction IIA-IIA in FIG. 16, in a power module according to a modified example of the third embodiment. Moreover, an enlarged view of the portion A of FIG. 19A is expressed as shown in FIG. 20. Moreover, a schematic bird's-eye view configuration after forming the mold resin layer 33 is similarly shown as FIG. 21.

In the power module 200 according to the modified example of the third embodiment, the insulation layer substrate 40 can be applied instead of the ceramics substrate 4, and thereby cost reduction and further thin-layering can be realized. The insulation layer substrate 40 can be formed of an organic insulating resin substrate etc., for example.

Moreover, the power module 200 according to the third embodiment includes the insulation layer substrate 40 as shown in FIGS. 16 and 19, and the first metallic circuit pattern 3 is disposed on the insulation layer substrate 40. Moreover, the second metallic circuit pattern 6 is disposed on the insulation layer substrate 40 in the same manner as the first metallic circuit pattern 3. Other configurations are the same as those of the power module according to the third embodiment. Moreover, the fabrication method for the power modules according to the third embodiment and its modified example is the same as that of the first embodiment and its modified example.

According to the third embodiment and its modified example, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

Fourth Embodiment

Figure 22:
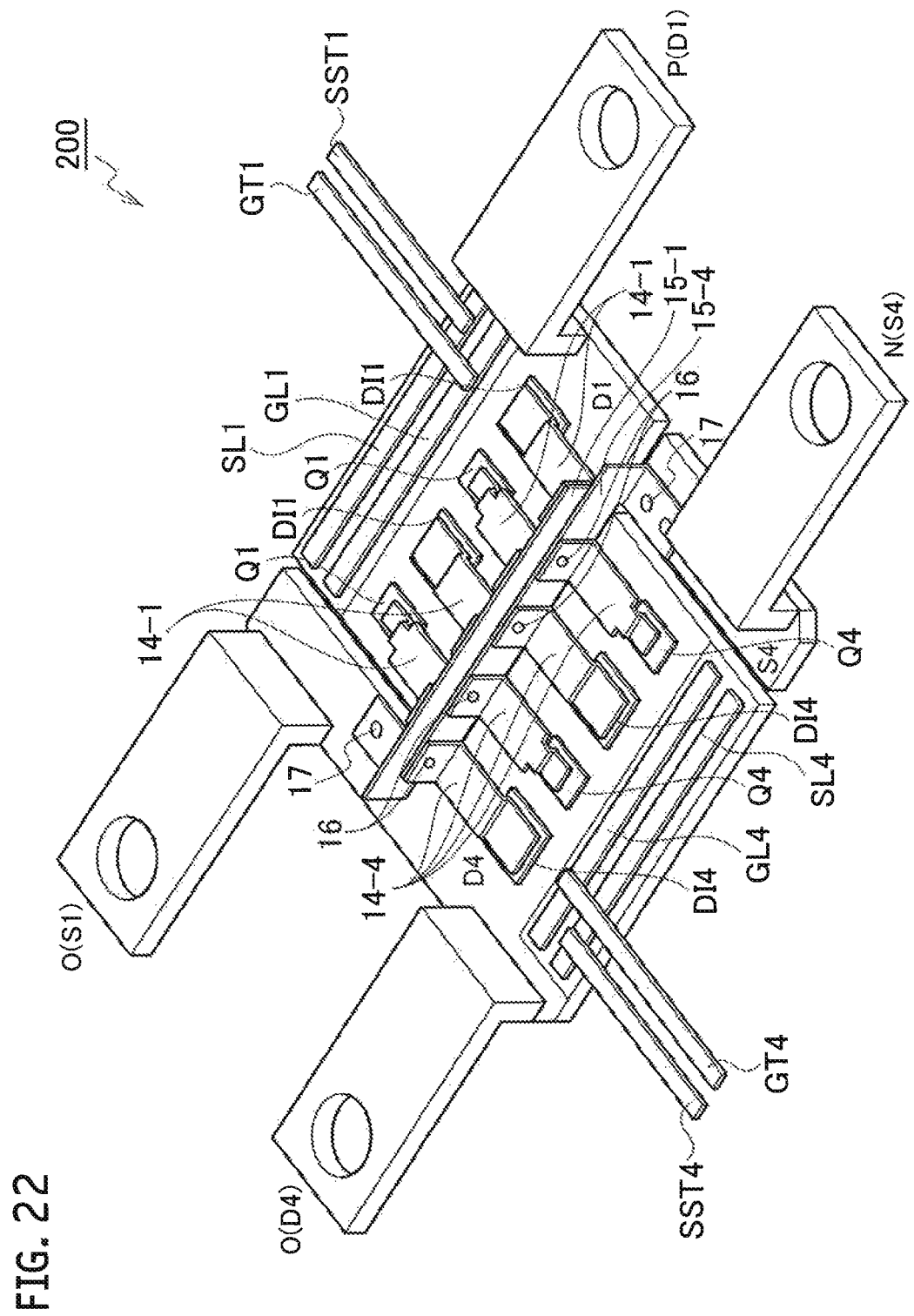
FIG. 22 is a schematic bird's-eye view configuration diagram before forming the mold resin layer in the 2-in-1 module (module with a built-in half-bridge), in a power module according to the fourth embodiment.

FIG. 22 is a schematic bird's-eye view configuration before forming the mold resin layer in the 2-in-1 module (module with a built-in half-bridge), in a power module 200 according to the fourth embodiment. In the power module 200 according to the fourth embodiment, as shown in FIG. 22, a metallic foil or a metallic plate (metallic frame) corresponding to a drain D4, a source S1, a source S4, and a drain D1, etc. is used, instead of using the insulating circuit substrate.

The power module 200 according to the fourth embodiment can compose power modules of 1200V/150 A class, for example. The semiconductor devices Q1, Q4 are composed of SiC TMOSFET, for example, and the semiconductor devices DI1, DI4 are composed of SBD, for example. Two semiconductor devices Q1 and two semiconductor devices Q4 are disposed respectively in parallel to one another. Two semiconductor devices DI1 and two semiconductor devices DI4 are also respectively disposed in parallel to one another. The chip size of one SiC TMOSFET is approximately 3.1 mm×approximately 4.4 mm, and the chip size of one SBD is approximately 5.14 mm×approximately 5.14 mm. Firing silver, e.g. Ag paste, an Ag particle layer, and an Ag nanoparticle layer, previously formed on the surface electrode and the back surface electrode of the semiconductor devices Q1, Q4 DI1, DI4 may be applied to the bonding layer under chip and the bonding layer on chip, as it is. The thickness of the firing silver is approximately 20 μm, for example.

The metallic frames corresponding to the leadframes 15-1, 15-4, the drain D4, the source S1, the source S4, the drain D1, etc. are formed of pure copper (C1020), for example, and the stress buffering layers 14-1, 14-4 are formed of covar (Fe-29Ni-17Co), for example.

In the power module 200 according to the fourth embodiment, positive-side power terminal P(D1), the negative-side power terminal N(S4), and the output terminals O(D4), O(S1) are connected to the metallic frame with pillar electrode structure etc., as shown in FIG. 22.

Moreover, as shown in FIG. 22, gate terminals GT1, GT4 and SST1, SST4 for external extraction are connected to the signal wiring patterns GL1, GL4 for gate and the signal wiring patterns SL1, SL4 for source sense by soldering etc. Note that a wire for gate and a wire for source sense connected towards the signal wiring patterns GL1, GL4 for gate and the signal wiring patterns SL1, SL4 for source sense from the MISFETs Q1, Q4 are not shown.

The power module 200 according to the fourth embodiment may be configured that the arm can be welded at the opposite side by providing the windows for laser light radiation 34 in the leadframes 15-1, 15-4. Moreover, as shown in FIG. 22, the leadframe 15-1 at the upper arm side and the leadframe 15-4 at the lower arm side are opposed to each other and disposed to be approximated to an opposed distance enough to secure an insulating breakdown voltage, and thereby a parasitic inductance of wiring can be reduced, and a surge voltage occurring at the time of switching can be reduced. Other configurations are the same as those of the power module 200 according to the third embodiment. Moreover, the fabrication method for the power module according to the fourth embodiment is the same as that of the first embodiment.

Modified Example

Figure 23:
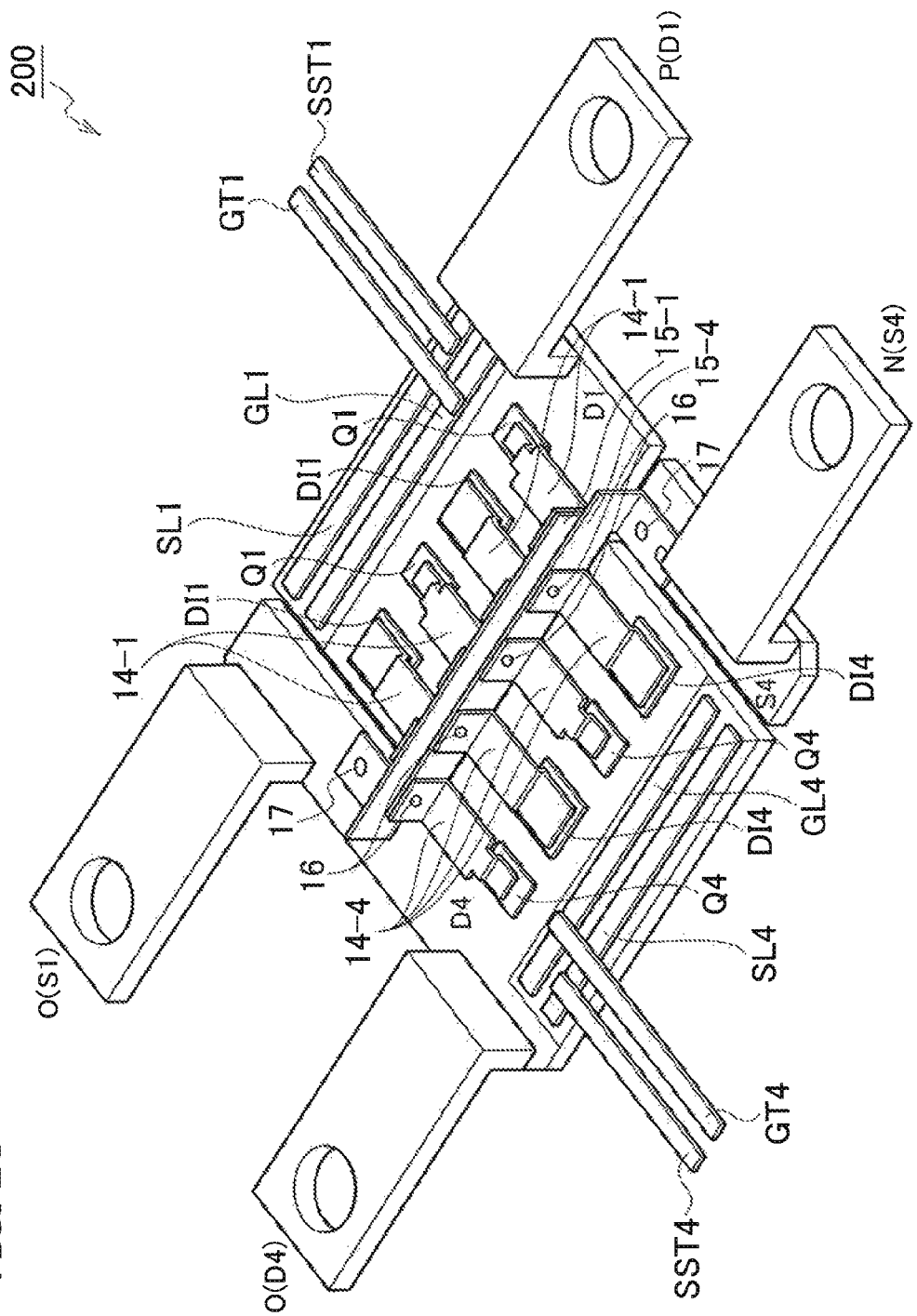
FIG. 23 is a schematic bird's-eye view configuration diagram before forming the mold resin layer in the 2-in-1 module (module with a built-in half-bridge), in a power module according to a modified example of the fourth embodiment.

FIG. 23 is a schematic bird's-eye view configuration before forming the mold resin layer in the 2-in-1 module (module with a built-in half-bridge), in a power module 200 according to an modified example of the fourth embodiment. In the power module 200 according to the modified example of the fourth embodiment, an arrangement configuration of the semiconductor devices Q1, DI1, Q4, DI4 is changed compared with that of the power module 200 according to the fourth embodiment. Other configurations are the same as those of the fourth embodiment. Moreover, the fabrication method for the power module according to the modified example of the fourth embodiment is the same as that of the first embodiment.

According to the fourth embodiment and its modified examples, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

Fifth Embodiment

Figure 24:
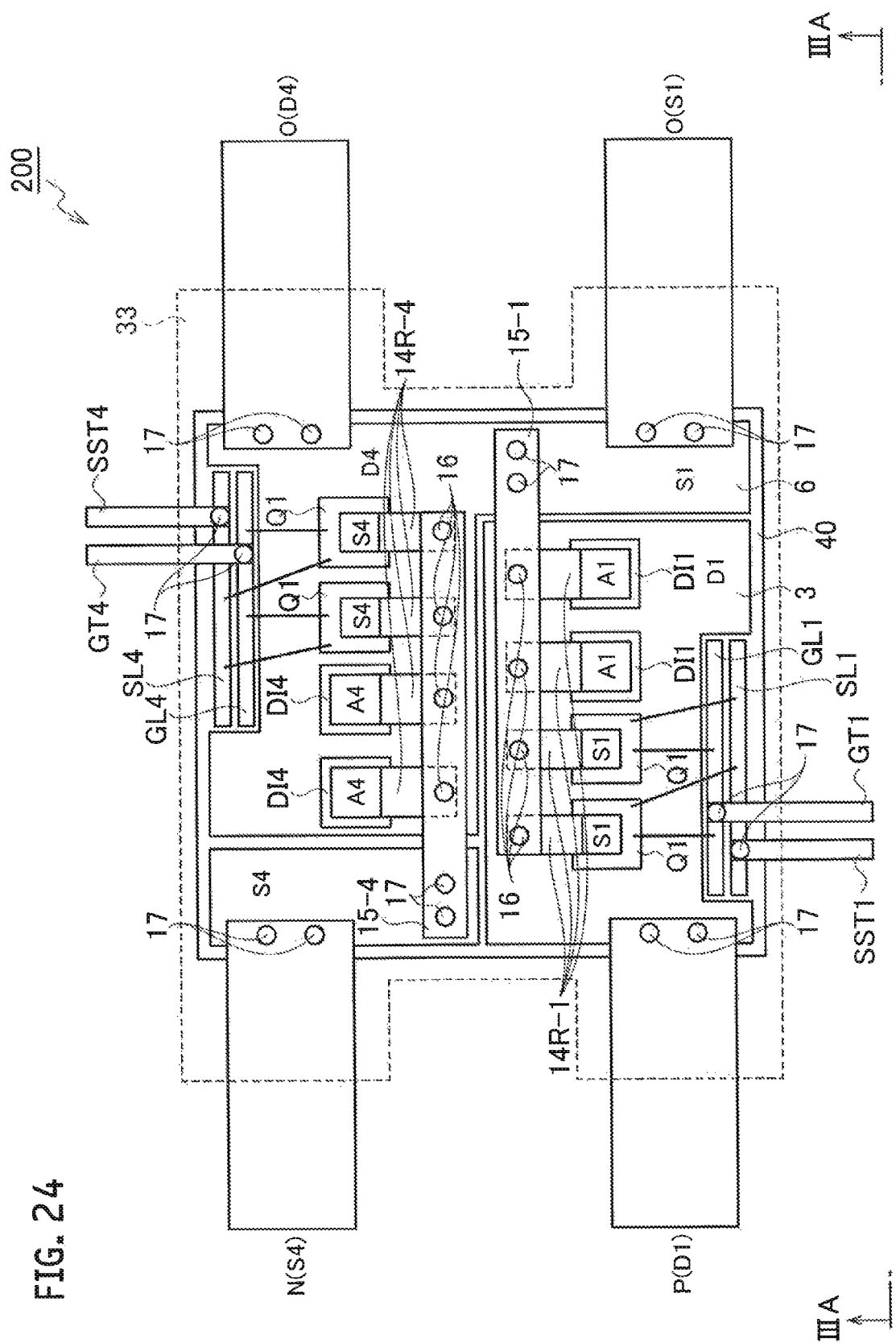
FIG. 24 is a schematic planar pattern configuration diagram before forming the mold resin layer in the 2-in-1 module (module with a built-in half-bridge), in a power module according to the fifth embodiment.

FIG. 24 is a schematic planar pattern configuration before forming the mold resin layer 33 in the 2-in-1 module (module with a built-in half-bridge), in a power module 200 according to the fifth embodiment. Moreover, a schematic bird's-eye view configuration after forming the mold resin layer 33 is similarly shown as FIG. 21. In FIG. 24, a side view diagram observed from the direction IIIA-IIIA is expressed, as shown in FIG. 25A, and an enlarged view of B portion of FIG. 25A is expressed as shown in FIG. 25B. Although the point of bonding the stress buffering layer on the semiconductor devices Q1, DI1, Q4, DI4 in the fifth embodiment is the same as that of the fourth embodiment, but a difference from the fourth embodiment is that the shape of the stress buffering layer is not L-shape, but is U-shape.

In the power module 200 according to the fifth embodiment, the stress buffering layers 14R-1, 14R-4 include U-shaped structure, the leadframes 15-1, 15-4 are isolated from the upper surface of the semiconductor devices Q1, DI1, Q4, DI4, and are disposed on the U-shaped side surface of the stress buffering layers 14R-1, 14R-4 in a direction parallel to the upper surface of the semiconductor devices Q1, DI1, Q4, DI4, and then are bonded at the welded portion 16 by the laser welding, as same as those of FIGS. 15A and 15B. Accordingly, even if there is a variation in the laser welding (variation in the amount of penetration), the semiconductor devices Q1, DI1, Q4, DI4 are not damaged, thereby improving yields. Moreover, it is also possible to achieve high intensity due to a spring effect produced from the U-shaped structure by using the stress buffering layers 14R-1, 14R-4 having U-shaped structure.

The welded portion 16 is irradiated with the laser light applicable to the fabricating technology of the power module 200 according to the fifth embodiment, via a window for laser light radiation. The window for laser light radiation should just be a spatial space in which the welded portion 16 can be irradiated with the laser light hv. The direction of radiation of the laser light hv is a direction vertical to the surface of the leadframes 15-1, 15-4 disposed on outside of the U-shaped side surface of the stress buffering layers 14R-1, 14R-4, in FIG. 24, for example.

The power module 200 according to the fifth embodiment includes an insulation layer substrate 40 as shown in FIGS. 24 and 25, and metallic circuit patterns (metallic frames) 3, 6 corresponding to the drain D4, the source S1, the source S4, the drain D1, etc. are disposed on the insulation layer substrate 40. Cost reduction and thin-layering can be realized by applying the insulation layer substrate 40 thereto. The insulation layer substrate 40 can be formed of an organic insulating resin substrate etc., for example. In the power module according to the fifth embodiment, a ceramics substrate 4 may be applied thereto, instead of the insulation layer substrate 40.

Also in the power module 200 according to the fifth embodiment, the leadframe 15-1 at the upper arm side and the leadframe 15-4 at the lower arm side are opposed to each other and disposed to be approximated to an opposed distance enough to secure an insulating breakdown voltage, and thereby a parasitic inductance of wiring can be reduced, and a surge voltage occurring at the time of switching can be reduced. Other configurations are the same as those of the second or third embodiment. Moreover, the fabrication method for the power module according to the fourth embodiment is the same as those of the second or third embodiment.

According to the fifth embodiment, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

(Examples of Power Module)

Hereinafter, there will now be explained examples of the power module according to the embodiments. Of course, also in the power module explained hereinafter, the following points are the same as those of the above-mentioned embodiments, that is: the power module, in which the semiconductor device is installed on a surface thereof, and the leadframe is bonded to an upper surface of the semiconductor device, includes structure of inserting materials having relatively low CTE, between the semiconductor device 1 and the leadframe, as a stress buffering layer for buffering of the CTE difference between the semiconductor device 1 and the leadframe; and the CTE of the stress buffering layer is equal to or less than the CTE of the leadframe, and a cross-sectional shape of the stress buffering layer is L-shape or U-shape. The following point is also the same as those of the above-mentioned embodiments, that is, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

Figure 26A:
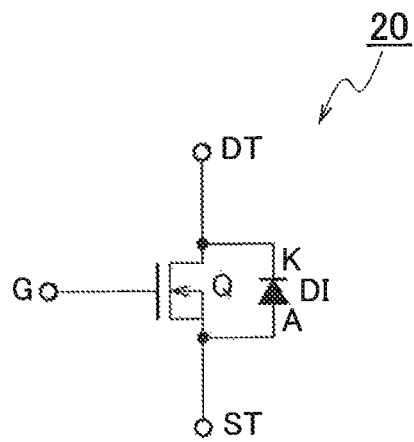
FIG. 26A is a schematic circuit representative diagram of the SiC MISFET of a 1-in-1 module, which is the power module according to the embodiments.
Figure 26B:
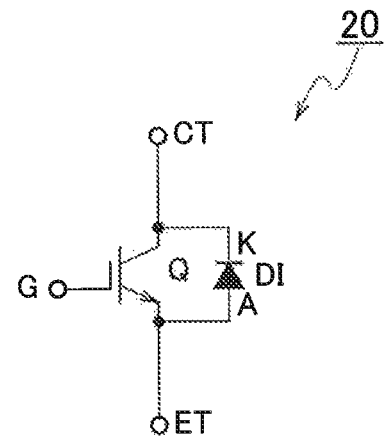
FIG. 26B is a schematic circuit representative diagram of an Insulated Gate Bipolar Transistor (IGBT) of the 1-in-1 module, which is the power module according to the embodiments.

FIG. 26A shows a schematic circuit representative of an SiC MISFET of the 1-in-1 module, which is the power module 20 according to the embodiments. FIG. 26B shows a schematic circuit representation of the IGBT of the 1-in-1 module.

A diode DI connected in reversely parallel to the MISFET Q is shown in FIG. 26A. A main electrode of the MISFET Q is expressed with a drain terminal DT and a source terminal ST. Similarly, a diode DI connected in reversely parallel to the IGBT Q is shown in FIG. 26B. A main electrode of the IGBT Q is expressed with a collector terminal CT and an emitter terminal ET. Moreover, FIG. 27 shows a detailed circuit representative of the SiC MISFET of the 1-in-1 module, which is the power module 20 according to the embodiments.

The power module 20 according to the embodiments includes a configuration of 1-in-1 module, for example. More specifically, one piece of the MISFET Q is included in one module. As an example, five chips (MISFET×5) can be mounted thereon, and a maximum of five pieces of the MISFETs respectively can be connected to one another in parallel. Note that it is also possible to mount a part of five pieces of the chips for the diode DI thereon.

Figure 27:
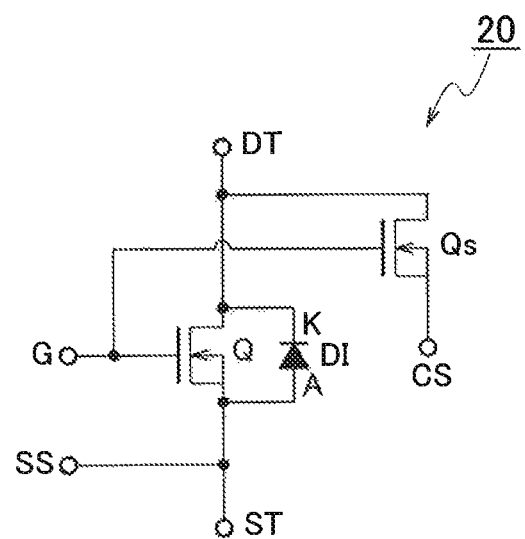
FIG. 27 is a detail circuit representative diagram of the SiC MISFET of the 1-in-1 module, which is the power module according to the embodiments.

More particularly, as shown in FIG. 27, a sense MISFET Qs is connected to the MISFET Q in parallel. The sense MISFET Qs is formed as a minuteness transistor in the same chip as the MISFET Q. In FIG. 27, reference numeral SS denotes a source sense terminal, reference numeral CS denotes a current sense terminal, and reference numeral G denotes a gate signal terminal. Note that, also in the semiconductor chip Q according to the embodiments, the sense MISFET Qs is formed as a minuteness transistor in the same chip.

Figure 28A:
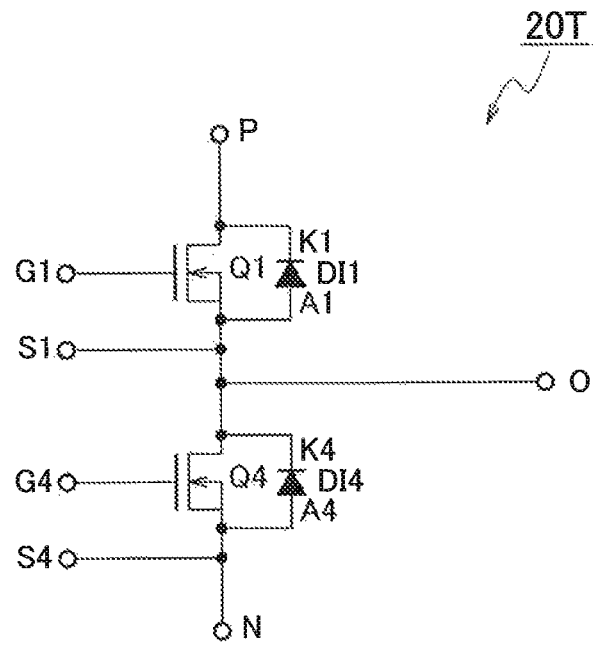
FIG. 28A is a schematic circuit representative diagram of the SiC MISFET of the 2-in-1 module, which is the power module according to the embodiments.

Moreover, FIG. 28A shows a schematic circuit representative of the SiC MISFET of the 2-in-1 module, which is the power module 20T according to the embodiments.

As shown in FIG. 28A, two MISFETs Q1, Q4, and diodes DI1, DI4 connected in reversely parallel to the MISFETs Q1, Q4 are built in one module. Reference numeral G1 denotes a gate signal terminal of the MISFET Q1, and reference numeral S1 denotes a source terminal of the MISFET Q1. Reference numeral G4 denotes a gate signal terminal of the MISFET Q4, and reference numeral S4 denotes a source terminal of the MISFET Q4. Reference numeral P denotes a positive side power input terminal, reference numeral N denotes a negative side power input terminal, and reference numeral O denotes an output terminal.

Figure 28B:
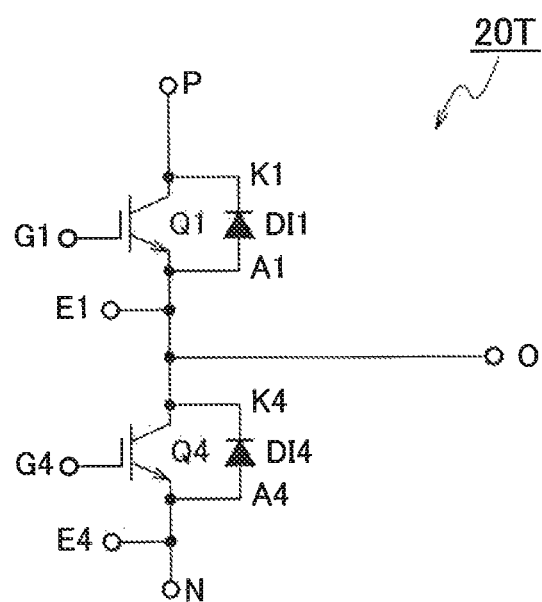
FIG. 28B is a schematic circuit representative diagram of the IGBT of the 2-in-1 module, in the power module according to the embodiments.

Moreover, FIG. 28B shows a schematic circuit representative of the 2-in-1 module, which is the power module 20 according to the embodiments. As shown in FIG. 28B, two IGBTs Q1, Q4, and diodes DI1, DI4 connected in reversely parallel to the IGBTs Q1, Q4 are built in one module. Reference numeral G1 denotes agate signal terminal of the IGBT Q1, and reference numeral E1 denotes an emitter terminal of the IGBT Q1. Reference numeral G4 denotes a gate signal terminal of the IGBT Q4, and reference numeral E4 denotes an emitter terminal of the IGBT Q4. Reference numeral P denotes a positive side power input terminal, reference numeral N denotes a negative side power input terminal, and reference numeral O denotes an output terminal.

(Configuration Example of Semiconductor Device)

FIG. 29A shows a schematic cross-sectional structure of an SiC MISFET, which is an example of a semiconductor device which can be applied to the power module according to the embodiments, and FIG. 29B shows a schematic cross-sectional structure of the IGBT.

As shown in FIG. 29A, a schematic cross-sectional structure of the SiC MISFET as an example of the semiconductor device 110 (Q) which can be applied to the power module according to the embodiments includes: a semiconductor substrate 126 composed of an $n^-$ type high resistivity layer; a p body region 128 formed on a front surface side of the semiconductor substrate 126; a source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an n+ drain region 124 disposed on a back side surface opposite to the surface of the semiconductor substrate 126; and a drain electrode 136 connected to the $n^+$ type drain area 124.

Although the semiconductor device 110 is composed of a planar-gate-type n channel vertical SiC-MISFET in FIG. 29A, the semiconductor device 110 may be composed of an n channel vertical SiC-TMISFET, etc., shown in FIG. 33 mentioned below.

Moreover, a GaN based FET etc. instead of SiC MISFET can also be adopted to the semiconductor device 110 (Q) which can be applied to the power module according to the embodiments.

Any one of an SiC based power device, a GaN based power device, or an AlN based power device can be adopted to the semiconductor device 110 applicable to the power module according to the embodiments.

Furthermore, a semiconductor of which the bandgap energy is from 1.1 eV to 8 eV, for example, can be used for the semiconductor device 110 applicable to the power module according to the embodiments.

Similarly, as shown in FIG. 29B, the IGBT as an example of the semiconductor device 110A (Q) applicable to the power module according to the embodiments includes: a semiconductor substrate 126 composed of an $n^-$ type high resistivity layer; a p body region 128 formed on a front surface side of the semiconductor substrate 126; an emitter region 130E formed on a front side surface of the p body region 128; a gate insulating film 132 disposed on a front side surface of the semiconductor substrate 126 between the p body regions 128; a gate electrode 138 disposed on the gate insulating film 132; an emitter electrode 134E connected to the emitter region 130E and the p body region 128; a $p^+$ collector region 124P disposed on a back side surface opposite to the surface of the semiconductor substrate 126; and a collector electrode 136 connected to the $p^+$ collector region 124P.

In FIG. 29B, although the semiconductor device 110 is composed of a planar-gate-type n channel vertical IGBT, the semiconductor device 110 may be composed of a trench-gate-type n channel vertical IGBT, etc.

FIG. 30 shows a schematic cross-sectional structure of an SiC MISFET including a source pad electrode SP and a gate pad electrode GP, which is an example of the semiconductor device 110 applicable to the power module according to the embodiments. The gate pad electrode GP is connected to the gate electrode 138 disposed on the gate insulating film 132, and the source pad electrode SP is connected to the source electrode 134 connected to the source region 130 and the p body region 128.

Moreover, as shown in FIG. 30, the gate pad electrode GP and the source pad electrode SP are disposed on an interlayer insulating film 144 for passivation which covers the surface of the semiconductor device 110. Microstructural transistor structure may be formed in the semiconductor substrate 126 below the gate pad electrode GP and the source pad electrode SP in the same manner as the center portion shown in FIG. 29A or 30.

Furthermore, as shown in FIG. 30, the source pad electrode SP may be disposed to be extended onto the interlayer insulating film 144 for passivation, also in the transistor structure of the center portion.

Figure 31:
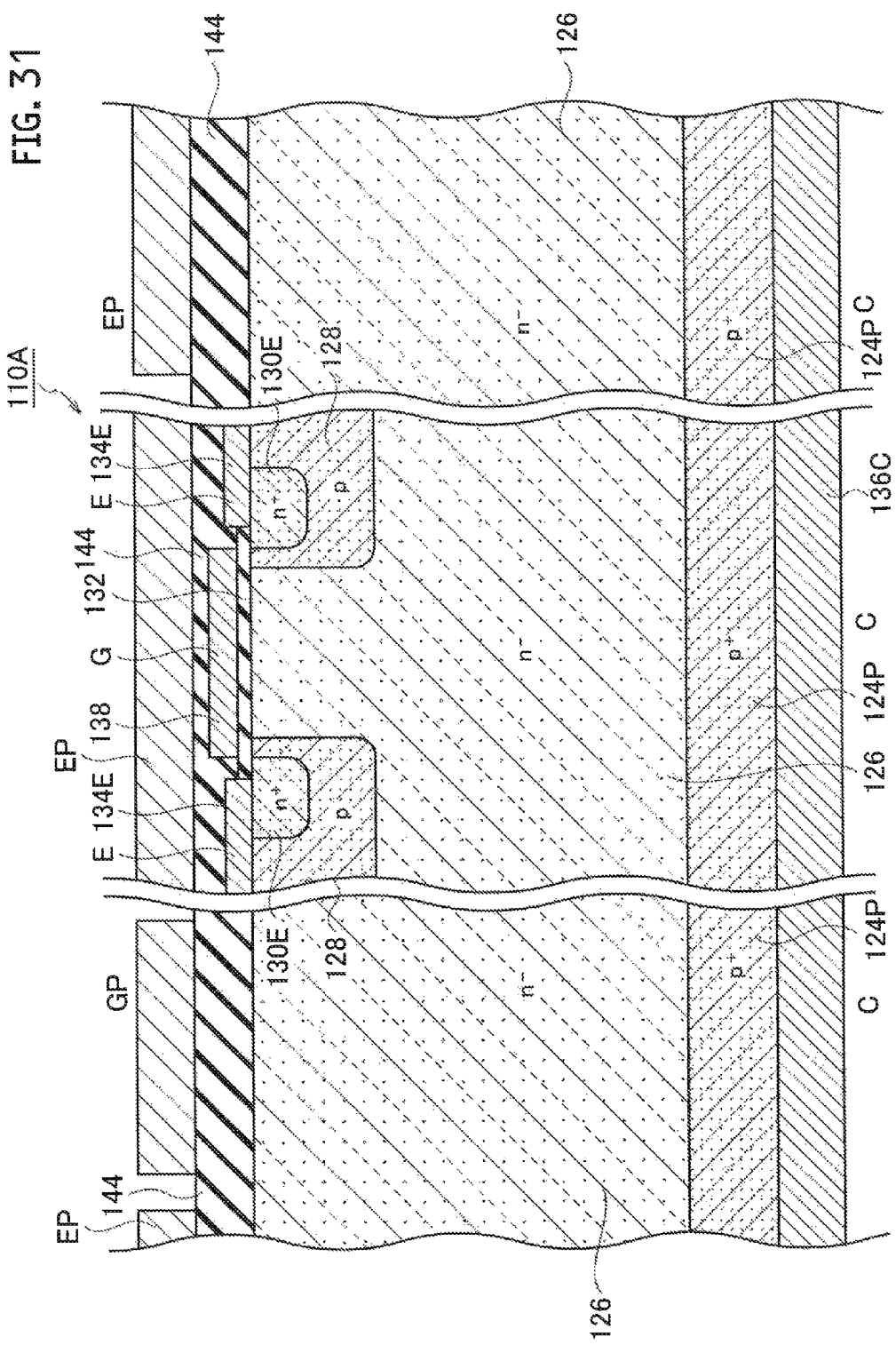
FIG. 31 is a schematic cross-sectional structure diagram of the IGBT including an emitter pad electrode EP and a gate pad electrode GP, which is an example of the semiconductor device to be applied to the power module according to the embodiments.

FIG. 31 shows a schematic cross-sectional structure of an IGBT including a source pad electrode SP and a gate pad electrode GP, which is an example of the semiconductor device 110A applied to the power modules 20, 20T according to the embodiments. The gate pad electrode GP is connected to the gate electrode 138 disposed on the gate insulating film 132, and the emitter pad electrode EP is connected to the emitter electrode 134E connected to the emitter region 130E and the p body region 128.

Moreover, as shown in FIG. 31, the gate pad electrode GP and the emitter pad electrode EP are disposed on an interlayer insulating film 144 for passivation which covers the surface of the semiconductor device 110A. Microstructural IGBT structure may be formed in the semiconductor substrate 126 below the gate pad electrode GP and the emitter pad electrode EP in the same manner as the center portion shown in FIG. 29B or 31.

Furthermore, as shown in FIG. 31, the emitter pad electrode EP may be disposed to be extended onto the interlayer insulating film 144 for passivation, also in the IGBT structure of the center portion.

—SiC DIMISFET—

Figure 32:
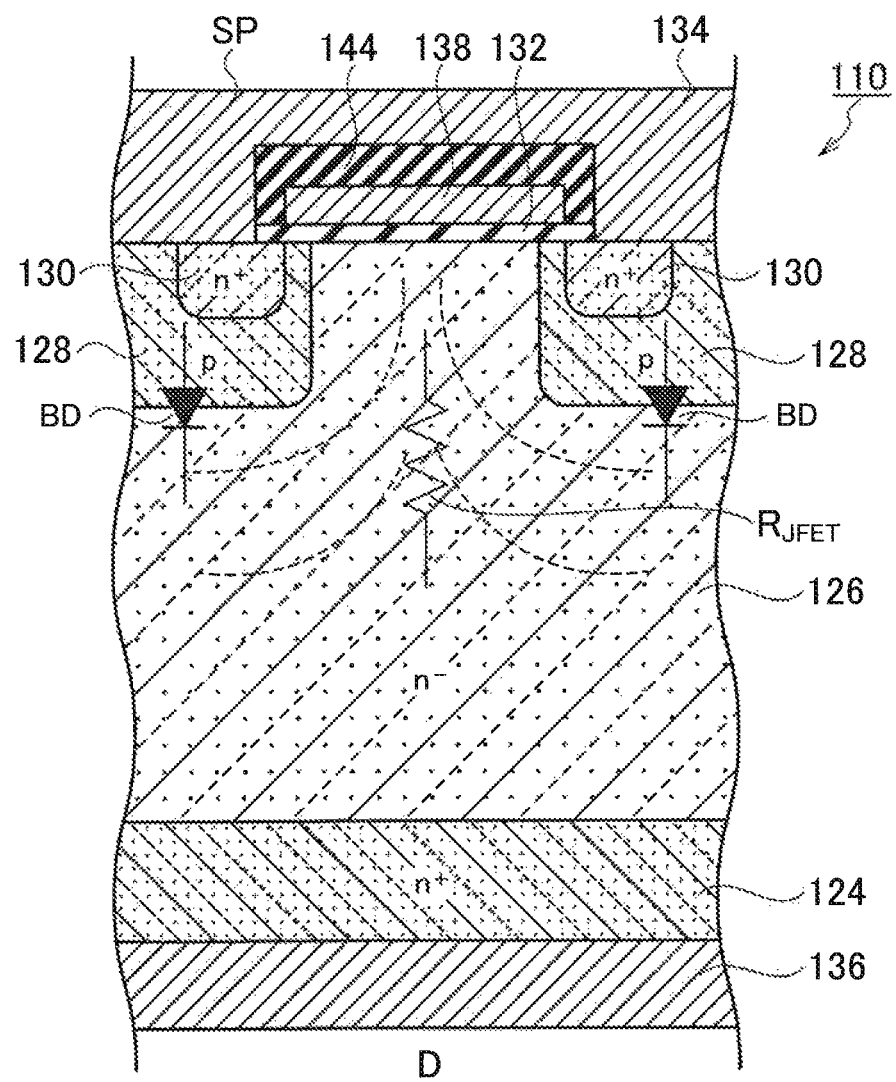
FIG. 32 is a schematic cross-sectional structure diagram of an SiC Double Implanted MISFET (SiC DIMISFET), which is an example of a semiconductor device which can be applied to the power module according to the embodiments.

FIG. 32 shows a schematic cross-sectional structure of an SiC DIMISFET, which is an example of a semiconductor device 110 which can be applied to the power module according to the embodiments.

As shown in FIG. 32, the SiC DIMISFET applicable to the power module according to the embodiments includes: a semiconductor substrate 126 composed of an $n^-$ type high resistivity layer; a p body region 128 formed on a front surface side of the semiconductor substrate 126; an $n^+$ source region 130 formed on a front side surface of the p body region 128; a gate insulating film 132 disposed on a front side surface of the semiconductor substrate 126 between the p body regions 128; a gate electrode 138 disposed on the gate insulating film 132; a source electrode 134 connected to the source region 130 and the p body region 128; an $n^+$ drain region 124 disposed on a back side surface opposite to the surface of the semiconductor substrate 126; and a drain electrode 136 connected to the n+ type drain area 124.

In the semiconductor device 110 shown in FIG. 32, the p body region 128 and the n+ source region 130 formed on the front side surface of the p body region 128 are formed with double ion implantation (DI), and the source pad electrode SP is connected to the source region 130 and the source electrode 134 connected to the p body region 128. A gate pad electrode GP (not shown) is connected to the gate electrode 138 disposed on the gate insulating film 132. Moreover, as shown in FIG. 32, the source pad electrode SP and the gate pad electrode GP (not shown) are disposed on an interlayer insulating film 144 for passivation configured to cover the front side surface of the semiconductor device 110.

As shown in FIG. 32, in the SiC DIMISFET, since a depletion layer as shown with the dashed lines is formed in the semiconductor substrate 126 composed of a n− type high resistivity layer inserted into the p body regions 128, channel resistance $R_{JFET}$ accompanying the junction type FET (JFET) effect is formed. Moreover, as shown in FIG. 32, body diodes BD are respectively formed between the p body regions 128 and the semiconductor substrates 126.

—SiC TMISFET—

Figure 33:
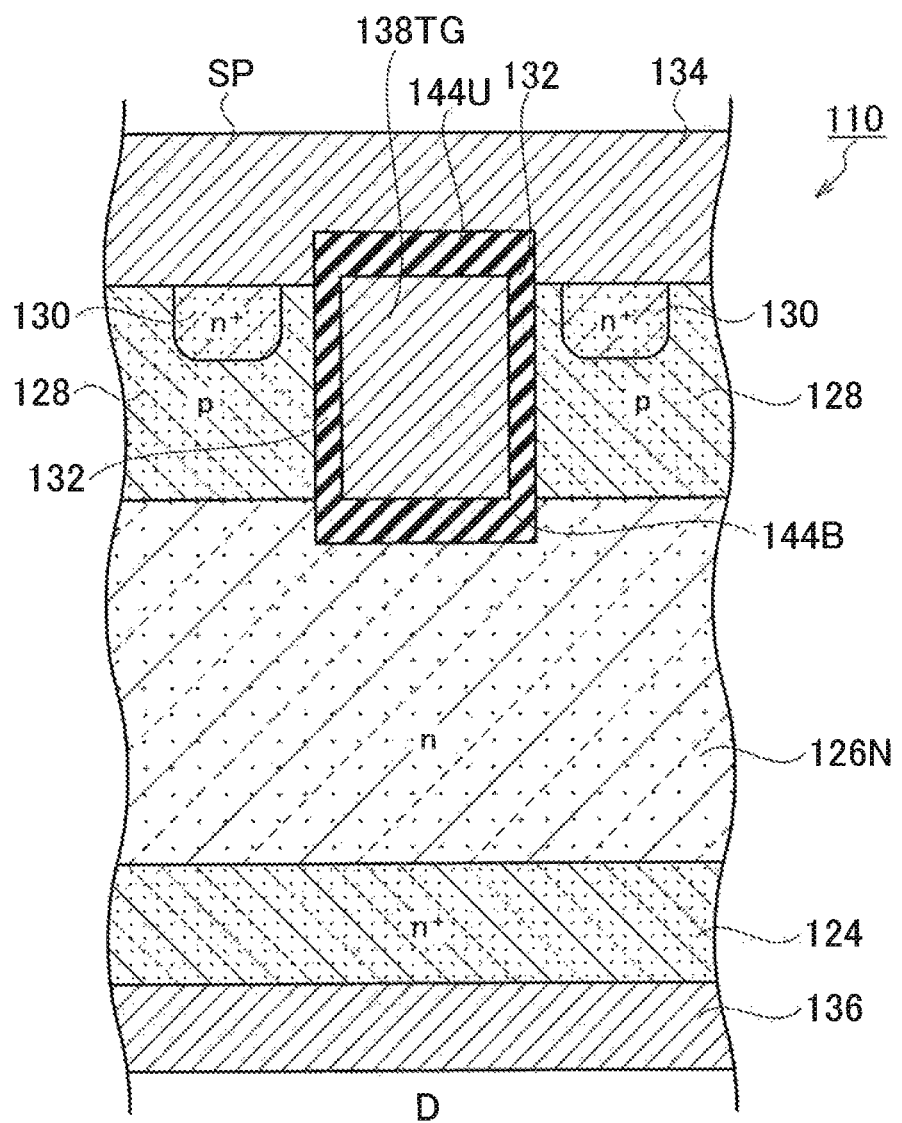
FIG. 33 is a schematic cross-sectional structure diagram of an SiC Trench MISFET (SiC TMISFET), which is an example of a semiconductor device which can be applied to the power module according to the embodiments.

FIG. 33 shows a schematic cross-sectional structure of an SiC TMISFET, which is an example of a semiconductor device 110 which can be applied to the power module according to the embodiments.

As shown in FIG. 33, the SiC TMISFET applicable to the power module according to the embodiments includes: a semiconductor substrate 126N composed of an n− type high resistivity layer; a p body region 128 formed on a front surface side of the semiconductor substrate 126N; an n+ source region 130 formed on a front side surface of the p body region 128; a trench gate electrode 138TG passing through the p body region 128, the trench gate electrode 138TG formed in the trench formed up to the semiconductor substrate 126N via the gate insulating layer 132 and the interlayer insulating films 144U, 144B; a source electrode 134 connected to the source region 130 and the p body region 128; an n+ type drain area 124 disposed on a back side surface of the semiconductor substrate 126N opposite to the front side surface thereof; and a drain electrode 136 connected to the n+ type drain area 124.

In the semiconductor device 110 shown in FIG. 33, a trench gate electrode 138TG passing through the p body region 128 is formed in the trench formed up to the semiconductor substrate 126N via the gate insulating layer 132 and the interlayer insulating films 144U, 144B; and the source pad electrode SP is connected to the source region 130 and the source electrode 134 connected to the p body region 28. A gate pad electrode GP (not shown) is connected to the gate electrode 138 disposed on the gate insulating film 132. Moreover, as shown in FIG. 33, the source pad electrode SP and the gate pad electrode GP (not shown) are disposed on an interlayer insulating film 144U for passivation configured to cover the front side surface of the semiconductor device 110.

In the SiC TMISFET, channel resistance $R_{JFET}$ accompanying the junction type FET (JFET) effect as the SiC DIMISFET is not formed. Moreover, body diodes BD are respectively formed between the p body regions 128 and the semiconductor substrates 126, in the same manner as FIG. 2.

Figure 34A:
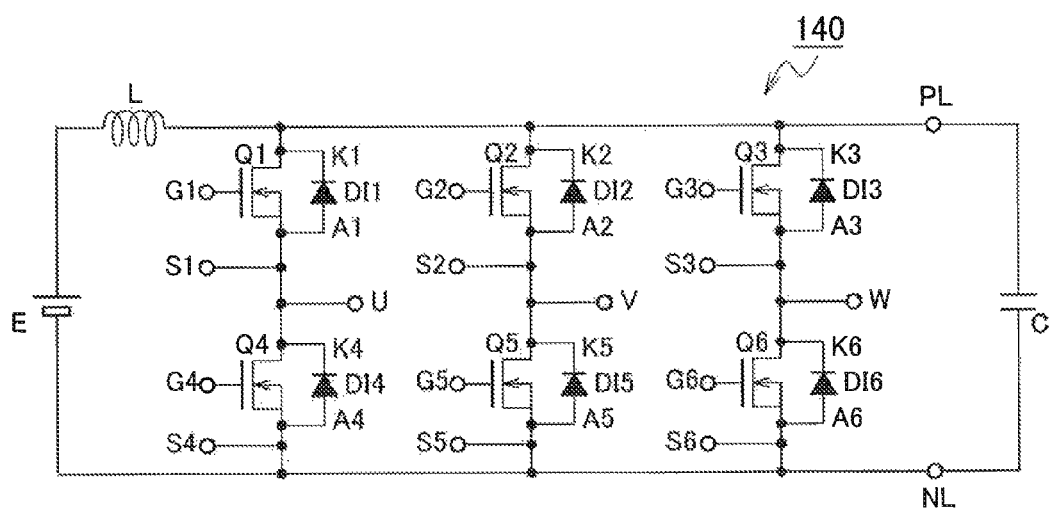
FIG. 34A shows an example of a circuit configuration in which the SiC MISFET is applied as a semiconductor device, and a snubber capacitor is connected between a power terminal PL and an earth terminal (ground terminal) NL, in a schematic circuit configuration of a three-phase alternating current (AC) inverter composed using the power module according to the embodiments.
Figure 34B:
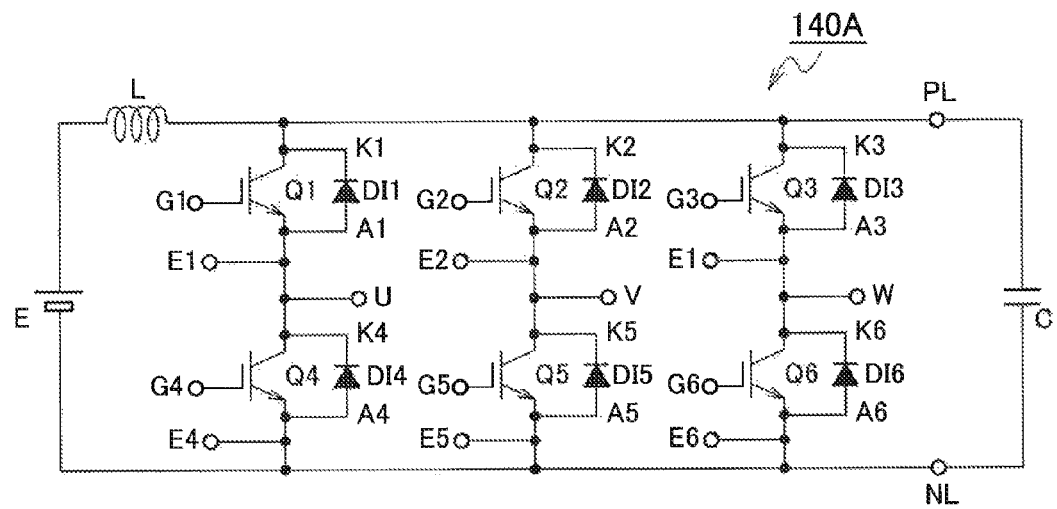
FIG. 34B shows an example of a circuit configuration in which the IGBT is applied as a semiconductor device, and the snubber capacitor is connected between the power terminal PL and the earth terminal (ground terminal) NL, in the schematic circuit configuration of a three-phase AC inverter composed using the power module according to the embodiments.

FIG. 34A shows an example of a circuit configuration in which the SiC MISFET is applied as a semiconductor device, and a snubber capacitor C is connected between the power terminal PL and the earth terminal (ground terminal) NL, in a schematic circuit configuration of a three-phase AC inverter 140 composed using the power module according to the embodiments. Similarly, FIG. 34B shows an example of a circuit configuration in which the IGBT is applied as a semiconductor device, and a snubber capacitor C is connected between the power terminal PL and the earth terminal (ground terminal) NL, in a schematic circuit configuration of a three-phase AC inverter 140A composed using the power module according to the embodiments.

When connecting the power module according to the embodiments to the power source E, large surge voltage Ldi/dt is produced by an inductance L included in a connection line due to a high switching speed of the SiC MISFET and IGBT. For example, the surge voltage Ldi/dt is expressed as follows: Ldi/dt=3×10$^9$ (A/s), where a current change di=300 A, and a time variation accompanying switching dt=100 ns. Although a value of the surge voltage Ldi/dt changes dependent on a value of the inductance L, the surge voltage Ldi/dt is superimposed on the power source V. Such a surge voltage Ldi/dt can be absorbed by the snubber capacitor C connected between the power terminal PL and the earth terminal (ground terminal) NL.

(Application Examples for Applying Power Module)

Next, there will now be explained the three-phase AC inverter 140 composed using the power module according to the embodiments to which the SiC MISFET is applied as the semiconductor device, with reference to FIG. 35.

Figure 35:
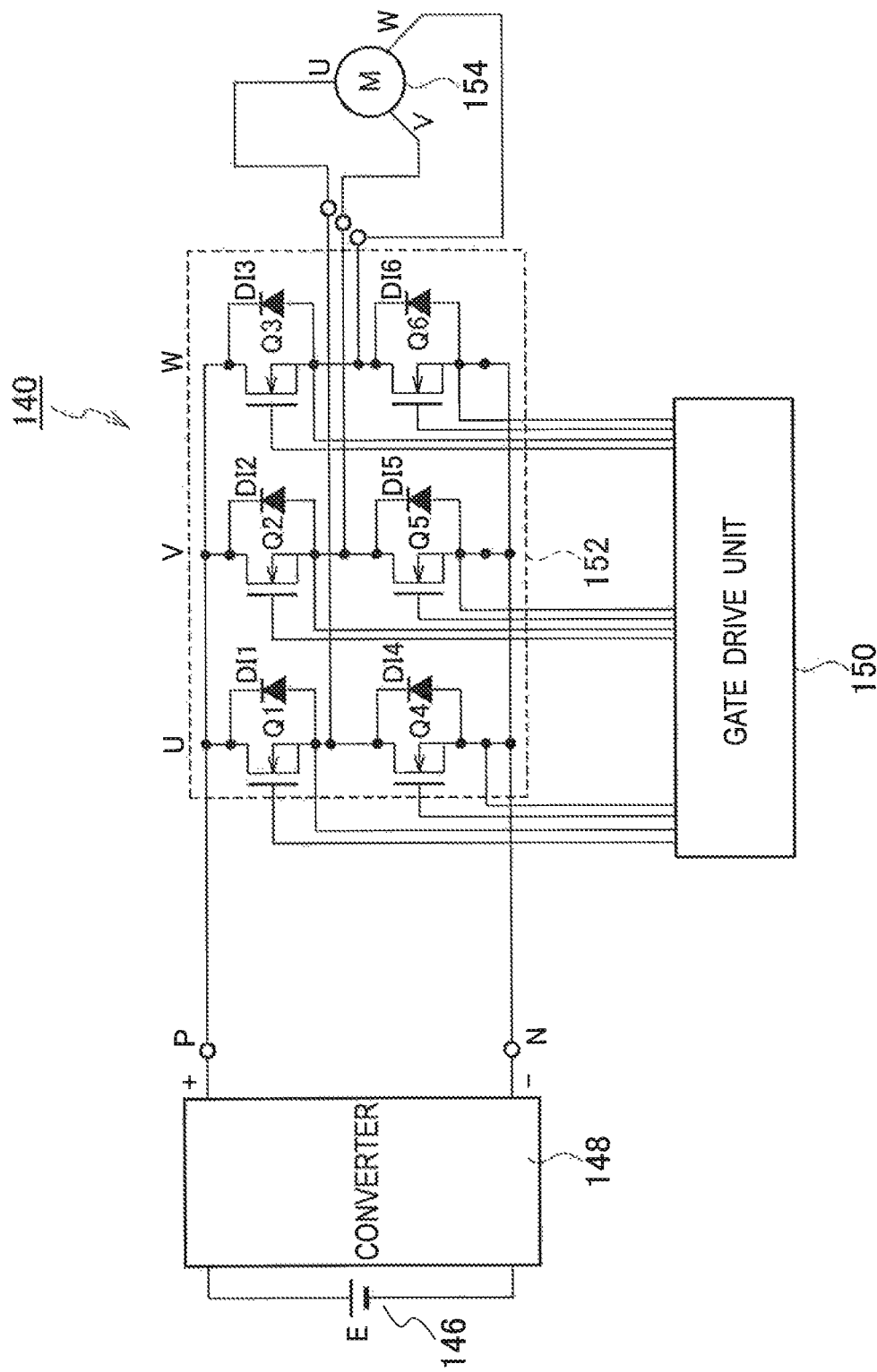
FIG. 35 is a schematic circuit configuration diagram of a three-phase AC inverter composed using the power module according to the embodiments to which the SiC MISFET is applied as the semiconductor device.

As shown in FIG. 35, the three-phase AC inverter 140 includes a gate drive unit 150, a power module unit 152 connected to the gate drive unit 150, and a three-phase AC motor unit 154. U-phase, V-phase, and W-phase inverters are respectively connected to the three-phase AC motor unit 54 so as to correspond to U phase, V phase, and W phase of the three-phase AC motor unit 154, in the power module unit 152. In the present embodiments, the gate drive unit 150 is connected to the SiC MISFETs Q1, Q4, SiC MISFETs Q2, Q5, and the SiC MISFETs Q3, Q6.

The power module unit 152 includes the SiC MISFETs Q1, Q4, and Q2, Q5, and Q3, Q6 having inverter configurations connected between a positive terminal (+) and a negative terminal (−) to which the converter 148 in a storage battery (E) 146 is connected. Moreover, flywheel diodes D1-D6 are respectively connected reversely in parallel between the source and the drain of the SiC MISFETs Q1-Q6.

Next, there will now be explained the three-phase AC inverter 140A composed using the power module 20T according to the embodiments to which the IGBT is applied as the semiconductor device, with reference to FIG. 36.

Figure 36:
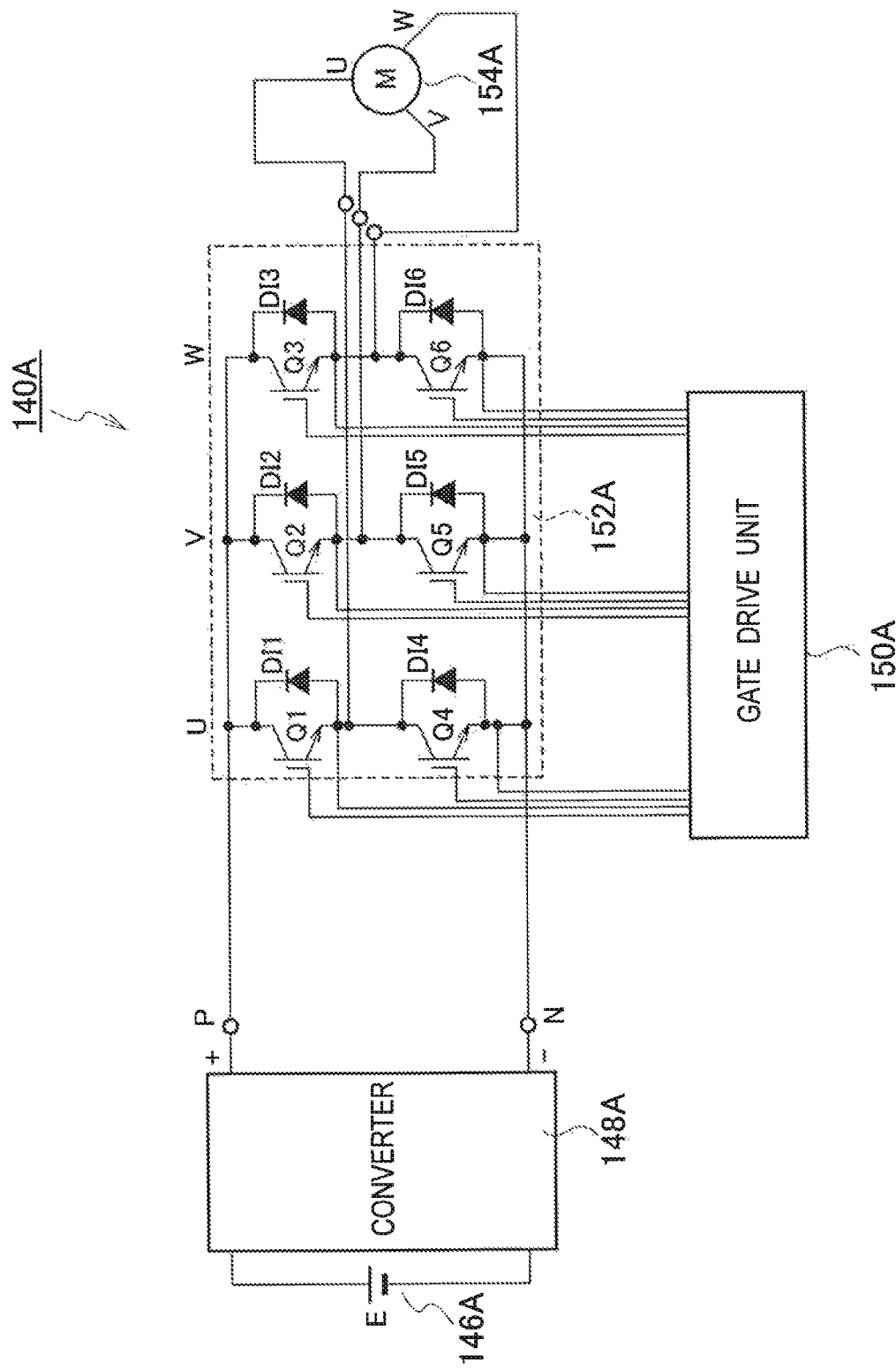
FIG. 36 is a schematic circuit configuration diagram of a three-phase AC inverter composed using the power module according to the embodiments to which the IGBT is applied as the semiconductor device.

As shown in FIG. 36, the three-phase AC inverter 140A includes a gate drive unit 150A, a power module unit 152A connected to the gate drive unit 150A, and a three-phase AC motor unit 154A. U-phase, V-phase, and W-phase inverters are respectively connected to the three-phase AC motor unit 54 so as to correspond to U phase, V phase, and W phase of the three-phase AC motor unit 154A, in the power module unit 152A. In the present embodiments, the gate drive unit 150A is connected to the IGBTs Q1, Q4, IGBTs Q2, Q5, and the IGBTs Q3, Q6.

The power module unit 152A includes the IGBTs Q1, Q4, and Q2, Q5, and Q3, Q6 having inverter configurations connected between a positive terminal (+) and a negative terminal (−) to which the converter 148A in a storage battery (E) 146A is connected. Furthermore, flywheel diodes DI1-DI6 are respectively connected reversely in parallel between the emitter and the collector of the IGBTs Q1-Q6.

The power module according to the embodiments can be formed as any one selected from the group consist of 1-in-1 module, 2-in-1 module, 4-in-1 module, 6-in-1 module, and 7-in-1 module.

Moreover, one semiconductor device selected from the group consist of IGBT, a diode, Si based MISFET, and SiC based MISFET and GaNFET, for example, is applicable to the power module according to the embodiments.

As explained above, according to the embodiments, there can be provided the power module capable of realizing miniaturization and large current capacity, and reducing cost thereof by using leadframe structure, and capable of reducing a variation in welding and improving a yield without damaging a semiconductor device; and a fabrication method for such a power module.

Other Embodiments

As explained above, the embodiments have been described, as a disclosure including associated description and drawings to be construed as illustrative, not restrictive. This disclosure makes clear a variety of alternative embodiment, working examples, and operational techniques for those skilled in the art.

Such being the case, the embodiments cover a variety of embodiments, whether described or not.

INDUSTRIAL APPLICABILITY

The power module according to the embodiments can be used for semiconductor modules, e.g. IGBT modules, diode modules, MOS modules (Si, SiC, GaN), etc., and structure which does not use insulating substrates, e.g. DBC, in case type modules; and can be applied to wide applicable fields, e.g. inverters for HEV/EV, inverter and converters for industrial applications, etc.

What is claimed is:

1. A power module comprising:
   a first metallic circuit pattern;
   a semiconductor device disposed on the first metallic circuit pattern;
   a leadframe electrically connected to the semiconductor device; and
   a stress buffering layer disposed on an upper surface of the semiconductor device, stress buffering layer capable of buffering a coefficient of thermal expansion (CTE) difference between the semiconductor device and the leadframe, wherein
   the leadframe is connected to the semiconductor device via the stress buffering layer, wherein
   a CTE of the stress buffering layer is less than a CTE of the leadframe, and a difference between a CTE of the semiconductor device and the CTE of the stress buffering layer is smaller than a difference between the CTE of the semiconductor device and the CTE of the leadframe, wherein
   a cross-sectional shape of the stress buffering layer is L-shape comprising a first side surface and a second side surface, the first side surface of the stress buffering layer configured to extend in a direction parallel to the upper surface of the semiconductor device so as to be connected to the semiconductor device, the second side surface of the stress buffering layer configured to extend in a direction vertical to the upper surface of the semiconductor device, wherein
   the leadframe is connected to the second side surface of the stress buffering layer.

2. The power module according to claim 1, wherein
   the leadframe is connected to the second side surface of the stress buffering layer, and
   the leadframe and the stress buffering layer are arranged in the direction parallel to the upper surface of the semiconductor device.

3. The power module according to claim 1, wherein
   the leadframe comprising a window for laser light radiation, and laser light radiation to anther leadframe opposite to the leadframe is possible via the window for laser light radiation.

4. The power module according to claim 1, wherein
   the stress buffering layer and the leadframe are bonded to each other through a laser welding portion.

5. The power module according to claim 1, wherein
   the stress buffering layer and the leadframe are bonded to each other through a spot welding portion.

6. The power module according to claim 1, wherein
   an electrical bonding layer between the metallic circuit pattern surface and the semiconductor device comprises fired silver.

7. The power module according to claim 1, wherein
   an electrical bonding layer between the semiconductor device and the stress buffering layer comprises fired silver.

8. The power module according to claim 1, wherein
   the stress buffering layer comprises a covar or invar.

9. The power module according to claim 1, wherein
   the stress buffering layer comprises any one selected from the group consist of an Fe—Ni based alloy and Ni—Mo—Fe based alloy.

10. The power module according to claim 1, further comprising:
    a second metallic circuit pattern connected to the leadframe.

11. The power module according to claim 10, wherein
    the leadframe and the second metallic circuit pattern are bonded to each other through a laser welding portion.

12. The power module according to claim 10, wherein
    the leadframe and the second metallic circuit pattern are bonded to each other through a spot welding portion.

13. The power module according to claim 4, wherein
    the laser comprises any one selected from the group consist of second harmonics of a YAG laser or YAG laser, a YLF laser, a $YVO_4$ laser, a KrF laser, a $CO_2$ laser, and a CO laser.

14. The power module according to claim 1, further comprising:
    a substrate; wherein
    the first metallic circuit pattern is disposed on the substrate.

15. The power module according to claim 13, wherein
    the substrate comprises any one selected from the group consist of a DBC substrate, a DBA substrate, and an AMB substrate.

16. The power module according to claim 13, comprising:
    an insulation layer substrate; wherein
    the first metallic circuit pattern is disposed on the insulation layer substrate.

17. The power module according to claim 16, wherein
    the insulation layer substrate comprises an organic insulating resin layer.

18. The power module according to claim 1, further comprising:
    a resin layer; wherein
    transfer molding is performed with the resin layer.

19. The power module according to claim 1, wherein the power module comprises any one selected from the group consist of 1-in-1 module, 2-in-1 module, 4-in-1 module, 6-in-1 module, and 7-in-1 module.

20. The power module according to claim 1, wherein the semiconductor device comprises any one selected from the group consist of IGBT, a diode, Si based MISFET, SiC based MISFET, and GaNFET.

* * * * *